United States Patent
Son et al.

(10) Patent No.: US 8,450,176 B2
(45) Date of Patent: May 28, 2013

(54) METHODS OF MANUFACTURING REWRITEABLE THREE-DIMENSIONAL SEMICONDUCTOR MEMORY DEVICES

(75) Inventors: Yong-Hoon Son, Yongin-si (KR); Kihyun Hwang, Seongnam-si (KR); Seungjae Baik, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 12/968,595

(22) Filed: Dec. 15, 2010

(65) Prior Publication Data

US 2011/0143524 A1 Jun. 16, 2011

(30) Foreign Application Priority Data

Dec. 15, 2009 (KR) .................. 10-2009-0124990

(51) Int. Cl.
*H01L 21/336* (2006.01)
(52) U.S. Cl.
USPC ............ 438/261; 365/185.01; 365/185.02; 365/185.03; 257/E21.676; 257/E21.693; 257/E21.422
(58) Field of Classification Search
USPC .... 365/185.01, 185.02, 185.03; 257/E21.422
See application file for complete search history.

(56) References Cited

U.S. PATENT DOCUMENTS

| | | | |
|---|---|---|---|
| 5,946,230 A | 8/1999 | Shimizo et al. | |
| 6,274,413 B1* | 8/2001 | Fang et al. | 438/149 |
| 6,380,032 B1 | 4/2002 | Lee et al. | |
| 6,483,749 B1 | 11/2002 | Choi et al. | |
| 6,870,216 B2 | 3/2005 | Hsiao et al. | |
| 6,933,556 B2 | 8/2005 | Endoh et al. | |
| 7,382,018 B2 | 6/2008 | Kim et al. | |
| 7,539,056 B2 | 5/2009 | Katsumata et al. | |
| 8,102,711 B2 | 1/2012 | Maejima | |
| 2006/0125029 A1* | 6/2006 | Kanda | 257/410 |
| 2007/0158736 A1 | 7/2007 | Arai et al. | |
| 2007/0173000 A1* | 7/2007 | Yamazaki | 438/151 |

(Continued)

FOREIGN PATENT DOCUMENTS

| | | |
|---|---|---|
| JP | 2006-338602 | 12/1994 |
| JP | 10-093038 | 4/1998 |

(Continued)

OTHER PUBLICATIONS

Fukuzumi et al., "Optimal Integration and Characteristics of Vertical Array Devices for Ultra-High Density, Bit-Cost Scalable Flash Memory," 2007 IEEE, pp. 449-452.

(Continued)

*Primary Examiner* — Michael Lebentritt
*Assistant Examiner* — Aaron Dehne
(74) *Attorney, Agent, or Firm* — Myers Bigel Sibley & Sajovec, P.A.

(57) ABSTRACT

Methods of forming nonvolatile memory devices include forming a vertical stack of nonvolatile memory cells on a substrate. This is done by forming a vertical stack of spaced-apart gate electrodes on a first sidewall of a vertical silicon active layer and treating a second sidewall of the vertical silicon active layer in order to reduce crystalline defects within the active layer and/or reduce interface trap densities therein. This treating can include exposing the second sidewall with an oxidizing species that converts a surface of the second sidewall into a silicon dioxide passivation layer. A buried insulating pattern may also be formed directly on the silicon dioxide passivation layer.

14 Claims, 29 Drawing Sheets

U.S. PATENT DOCUMENTS

| | | |
|---|---|---|
| 2007/0252201 A1 | 11/2007 | Kito et al. |
| 2008/0067583 A1 | 3/2008 | Kidoh et al. |
| 2009/0020744 A1 | 1/2009 | Mizukami et al. |
| 2009/0242968 A1 | 10/2009 | Maeda et al. |
| 2009/0268524 A1 | 10/2009 | Maejima |
| 2010/0109065 A1 | 5/2010 | Oh et al. |
| 2010/0178755 A1 | 7/2010 | Lee et al. |
| 2010/0181610 A1 | 7/2010 | Kim et al. |
| 2010/0195395 A1 | 8/2010 | Jeong et al. |
| 2010/0246257 A1 | 9/2010 | Ito et al. |
| 2011/0065270 A1 | 3/2011 | Shim et al. |
| 2011/0147824 A1 | 6/2011 | Son et al. |
| 2011/0156132 A1 | 6/2011 | Kiyotoshi |
| 2011/0291178 A1 | 12/2011 | Sasaki et al. |
| 2011/0316069 A1 | 12/2011 | Tanaka et al. |
| 2012/0001250 A1* | 1/2012 | Alsmeier .................. 257/319 |
| 2012/0039130 A1 | 2/2012 | Yoon et al. |
| 2012/0049148 A1 | 3/2012 | Fukano |

FOREIGN PATENT DOCUMENTS

| | | |
|---|---|---|
| JP | 2008-072051 | 3/2008 |
| JP | 2008-192708 | 8/2008 |
| JP | 2009-016400 | 1/2009 |
| KR | 1020060089547 A | 8/2006 |
| KR | 100707217 B1 | 4/2007 |
| KR | 1020070113535 A | 11/2007 |
| KR | 1020080070583 A | 7/2008 |
| KR | 1020090047614 A | 5/2009 |

OTHER PUBLICATIONS

Kim et al., "Future memory technology: challenges and opportunities," Symposium on VLSI-TSA Tech, 2008 IEEE, pp. 5-9.

Kim et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pp. 186-187.

Tanaka et al., "Bit Cost Scalable Technology with Punch and Plug Process for Ultra High Density Flash Memory," 2007 Symposium on VLSI Technology Digest of Technical Papers, pp. 14-15.

Program from the $6^{th}$ Semiconductor Memory Symposium, Feb. 25, 2008, 11:10-12:00pm, "Multi-Cell NAND-Based SSD Technology and its Trend," Toshiba Semiconductor Company, Memory Business Department, Assistant to Department Manager Shinji Saito, 8 pages.

Koga et al., "Influences of Buried-Oxide Interface on Inversion-Layer Mobility in Ultra-Thin SOI MOSFETs," IEEE Transactions on Electron Devices, vol. 49, No. 6, Jun. 2002, pp. 1042-1048.

Quirk Michael, Serda Julian, Semiconductor Manufacturing Technology, 2001, Prentice Hall Inc. pp. 58-59.

* cited by examiner

METHODS OF MANUFACTURING REWRITEABLE THREE-DIMENSIONAL SEMICONDUCTOR MEMORY DEVICES

REFERENCE TO PRIORITY APPLICATION

This application claims priority to Korean Patent Application No. 10-2009-0124990, filed Dec. 15, 2009, the contents of which are hereby incorporated herein by reference.

FIELD

The present invention relates to methods of manufacturing memory devices and, more particularly, to methods of manufacturing rewriteable memory devices.

BACKGROUND

Increasing an integration of a semiconductor device is required to satisfy superior performance and a low price which a consumer requires. In a semiconductor memory device, since integration is an important factor to determine a price of product, a high integration is particularly required. In a case of a conventional two-dimensional or flat semiconductor memory device, since an integration of the device is mainly determined by an area which a unit memory cell occupies, the integration of the device is greatly affected by a technology level of forming a fine pattern. However, since very expensive equipments are needed to realize a miniature of a pattern, a two-dimensional semiconductor memory device has a limitation in increasing integration.

To overcome the limitation, three-dimensional semiconductor memory devices including memory cells three dimensionally arranged have been introduced. However, to mass-produce a three-dimensional semiconductor memory device, a process technology is required, which can realize a reliable product characteristic while manufacturing costs per bit is less than that of a two-dimensional semiconductor memory device.

SUMMARY

Methods of forming nonvolatile memory devices according to embodiments of the invention include forming a vertical stack of nonvolatile memory cells on a substrate. This is done by forming a vertical stack of spaced-apart gate electrodes on a first sidewall of a vertical silicon active layer and treating a second sidewall of the vertical silicon active layer in order to reduce crystalline defects within the active layer and/or reduce interface trap densities therein. This treating can include exposing the second sidewall with an oxidizing species that converts a surface of the second sidewall into a silicon dioxide passivation layer. A buried insulating pattern may also be formed directly on the silicon dioxide passivation layer.

According to some embodiments of the invention, treating the second sidewall of the vertical silicon active layer may include converting the second sidewall of the silicon active layer into a silicon dioxide passivation layer using a dry thermal oxidation process. In particular, the treating may include converting the second sidewall of the silicon active layer into a silicon dioxide passivation layer using an $O_2$, $O_2/N_2$ and/or $O_2/N_2O$ gas in a dry thermal oxidation process. Alternatively, the treating may include converting the second sidewall of the silicon active layer into a silicon dioxide passivation layer using a $H_2/O_2$ and/or $H_2O$ gas in a wet thermal oxidation process.

According to still further embodiments of the invention, the treating may include converting the second sidewall of the silicon active layer into a silicon dioxide passivation layer using a hydrogen gas, an oxygen gas and/or a hydrogen chloride gas in a radical oxidation process. Additional embodiments of the invention may also include converting the second sidewall of the silicon active layer into a silicon dioxide passivation layer by oxidizing the second sidewall under an atmosphere containing a halogen gas selected from a group consisting of $HCl$, $HF$, $NF_3$, $HBr$, $Cl_2$, $BCl_3$, $F_2$ and $Br_2$.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
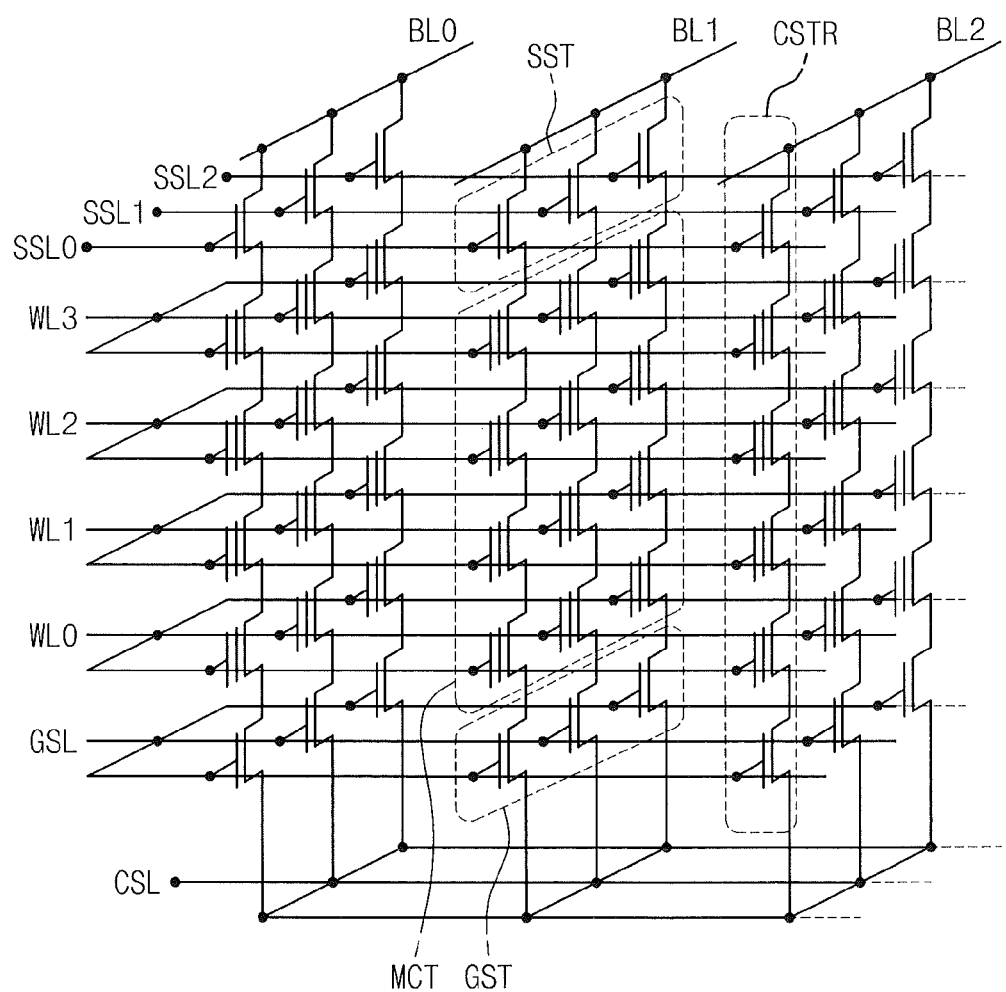
FIG. 1 is a circuit diagram of a three-dimensional semiconductor memory device in accordance with embodiments of the present inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

It will be understood that when an element such as a layer, region or substrate is referred to as being on or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for, example, of manufacturing techniques and/or tolerances, are to be expected. Thus, embodiments of the invention should not be construed as limited to the particular shapes of regions illustrated herein but are to comprise deviations in shapes that result, for example, from manufacturing.

Hereinafter, referring to the views, embodiments of the present inventive concept will be described in detail. A semiconductor memory device in accordance with embodiments of the present inventive concept has a three-dimensional structure.

Figure 2:
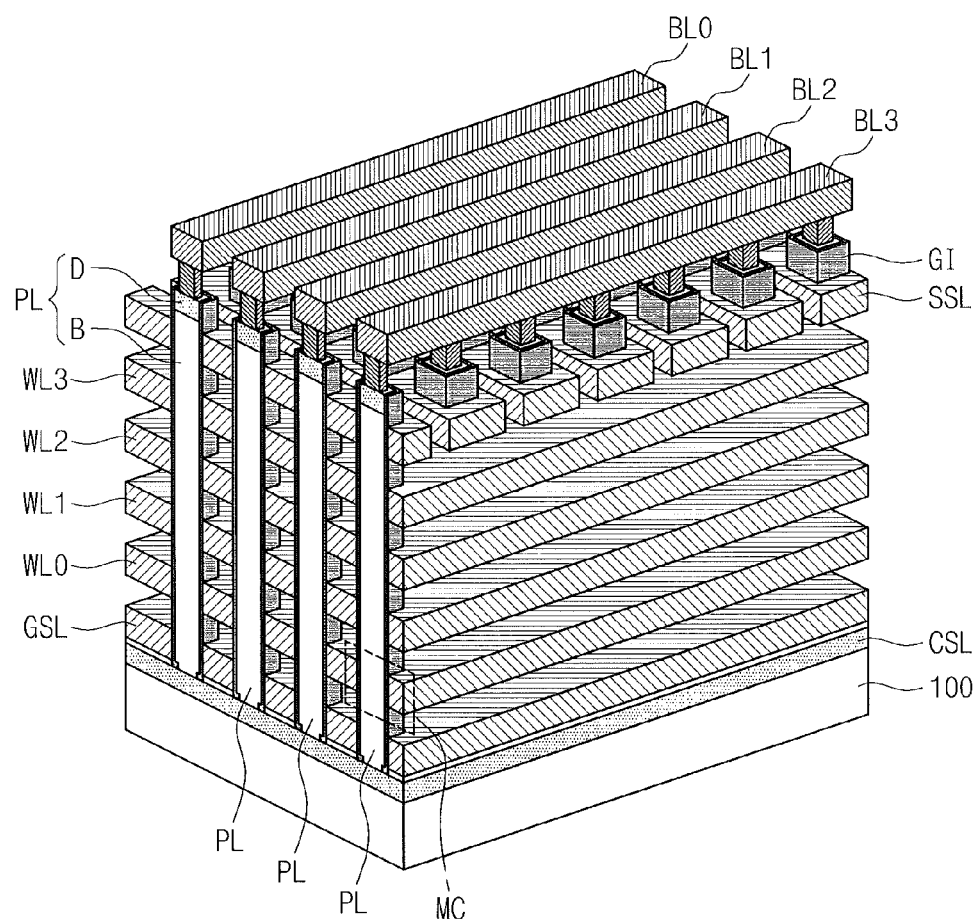
FIG. 2 is a perspective view of a three-dimensional semiconductor memory device in accordance with embodiments of the present inventive concept.

FIG. 1 is a circuit diagram of a three-dimensional semiconductor memory device in accordance with embodiments of the present inventive concept. FIG. 2 is a perspective view of a three-dimensional semiconductor memory device in accordance with embodiments of the present inventive concept. Referring to FIGS. 1 and 2, a three-dimensional semiconductor memory device in accordance with an embodiment may include a common source line CSL, a plurality of bit lines BL0, BL1, BL2 and BL3 and a plurality of cell strings CSTR disposed between the common source line CSL and the bit lines BL0, BL1, BL2 and BL3.

The common source line CSL may be a conductive thin layer disposed on a substrate 100 or an impurity region formed in the substrate 100. The bit lines BL~BL3 may be conductive patterns (for example, a metal line) disposed over the substrate 100 while being spaced apart from the substrate 100. The bit lines BL0~BL3 are arranged in two dimensions and a plurality of strings CSTR is connected to each of the bit lines BL0~BL3 in parallel. Accordingly, the cell strings CSTR are arranged to be two-dimensional on the common source line CSL or the substrate 100.

Each of the cell strings CSTR may be comprised of a ground select transistor GST connected to the common source line CSL, a string select transistor SST connected to the bit line and a plurality of memory cell transistors MCT disposed between the ground select transistor GST and the string select transistor SST. The ground select transistor GST, the string select transistor SST and the memory cell transistors MCT may be serially connected to one another. In addition, a ground select line GSL, a plurality of word lines WL0~WL3 and a plurality of string select lines SSL disposed between the common source line CSL and the bit lines BL0~BL3 may be used as gate electrodes of the ground select transistors GST, the memory cell transistors MCT and the string select transistors SST, respectively.

All of the ground select transistors GST may be disposed at a place spaced a same distance apart from the substrate 100 and the gate electrodes of the ground select transistors GST may be commonly connected to the ground select line GSL, thereby having an equipotential state. The ground select line GSL may be a conductive pattern having a plate shape or a comb shape disposed between the common source line CSL and the memory cell transistor MCT closest to the common source line CSL. Similarly, gate electrodes of a plurality of memory cell transistors MCT disposed at a place spaced a same distance apart from the common source line CSL may also be commonly connected to one of the word lines WL0~WL3, thereby having an equipotential state. Each of the word lines WL0~WL3 may be a conductive pattern having a plate shape parallel to a top surface of the substrate 100 or a comb shape. Since one cell string CSTR is comprised of a plurality of memory cells spaced a different distance apart from the common source line CSL, word lines WL0~WL3 of a multilayer are disposed between the common source line CSL and the bit lines BL0~BL3.

Each of the cell strings may include a semiconductor pillar PL vertically extended from the common source line CSL to be connected to the bit lines BL0~BL3. The semiconductor pillars PL may be formed to penetrate the ground select line GSL and the word lines WL0~WL3. In addition, the semiconductor pillar PL may include a body portion B and impurity regions formed on one side or both sides of the body portion B. For example, a drain region D, as illustrated in FIG. 2, may be formed on an upper portion (i.e., between the body portion B and the bit lines BL0~BL3) of the semiconductor pillar PL.

A data storage layer may be disposed between the word lines WL0~WL3 and the semiconductor pillar PL. According to an embodiment, the data storage layer may be a charge storage layer. For example, the data storage layer may be one of insulating layers including a trap insulating layer, a floating gate electrode or a conductive nano dots.

A dielectric layer used as an gate insulating layer of the ground select transistor GST or the string select transistor SST may be disposed between the ground select line GSL and the semiconductor pillar PL or between the string select line SSL and the semiconductor pillar PL. A gate insulating layer of at least one of the ground and string select transistors GST and SST may be formed of the same material as the data storage layer of the memory cell transistor MCT but may be a gate insulating layer (for example, a silicon oxide layer) for a conventional MOSFET.

The ground and string select transistors GST and SST and the memory cell transistors MCT may be a MOSFET using the semiconductor pillar PL as a channel region. According to another embodiment, the semiconductor pillar PL may constitute a MOS capacitor together with the ground select line (GSL), the word lines WL0~WL3 and the string select line SSL. In this case, the ground select transistor GST, the memory cell transistors MCT and the string select transistor SST may be electrically connected to one another by sharing inversion layers formed by a fringe field from the ground select line GSL, the word lines WL0~WL3 and the string select line SSL.

Figure 3:
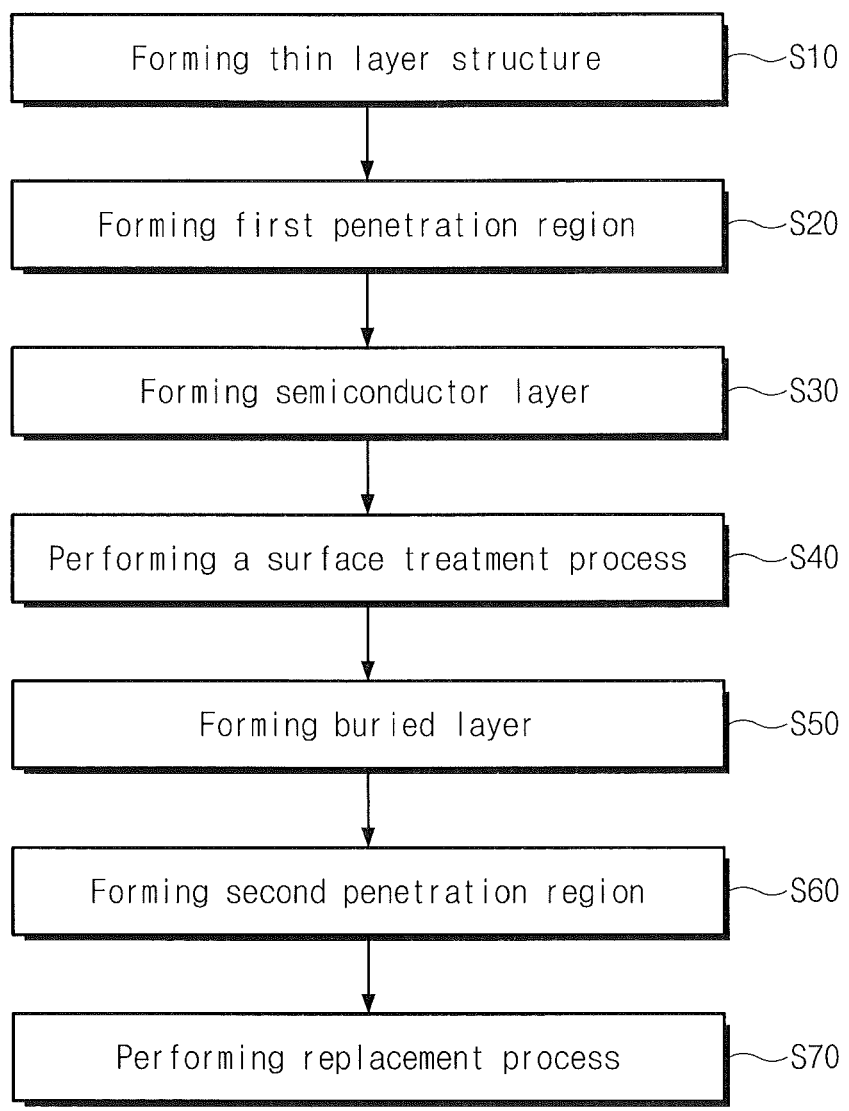
FIG. 3 is a flow chart illustrating a method of manufacturing a three-dimensional semiconductor memory device in accordance with an embodiment of the present inventive concept.

Hereinafter, referring to FIGS. 3 through 10, a method of manufacturing a three-dimensional semiconductor memory device in accordance with an embodiment of the present inventive concept will be described in detail. FIG. 3 is a flow chart illustrating a method of manufacturing a three-dimensional semiconductor memory device in accordance with an embodiment of the present inventive concept. FIGS. 4 through 10 are views sequentially illustrating a method of manufacturing a three-dimensional semiconductor memory device in accordance with an embodiment of the present inventive concept.

Figure 4:
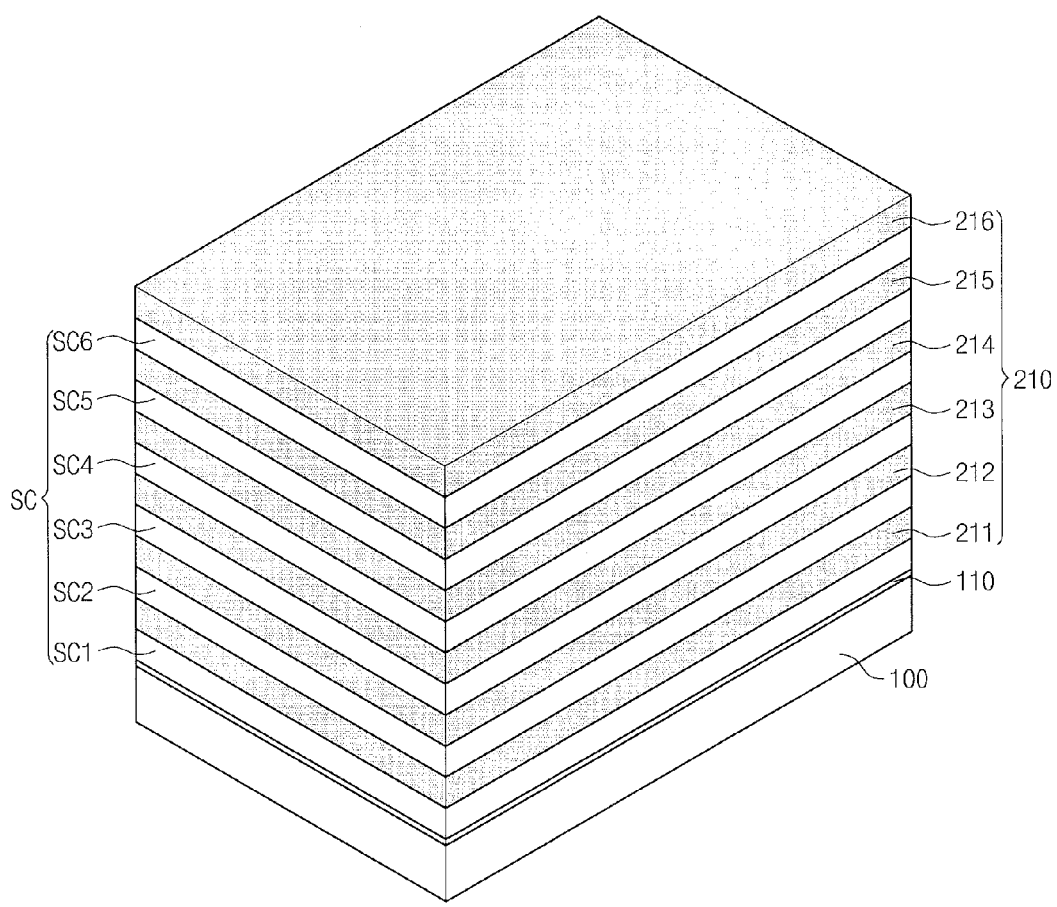
FIGS. 4 through 10 are views sequentially illustrating a method of manufacturing a three-dimensional semiconductor memory device in accordance with an embodiment of the present inventive concept.

Referring to FIGS. 3 and 4, a thin layer structure is formed on a substrate 100 (S10). The substrate 100 may be one of a material having a semiconductor characteristic (for example, a silicon wafer), an insulating material (for example, a glass) and a semiconductor covered with an insulating material and a conductor.

The thin layer structure may include a plurality of insulating layers (211~216: 210) and a plurality of sacrificial layers (SC1~SC6: SC). The insulating layers 210 and the sacrificial layers SC may, as illustrated in FIG. 3, be alternately and repeatedly stacked. The insulating layers 210 and the sacrificial layers SC may be formed of a material having an etching selectivity with respect to each other. For example, the insulating layer 210 may be at least one of a silicon oxide layer and a silicon nitride layer and the sacrificial layer SC may be a different material than the insulating layer 210 selected from a group consisting of a silicon layer, a silicon oxide layer, a silicon carbide and a silicon nitride layer.

According to an embodiment, before forming the thin layer structure, forming a conductive region on the substrate 100 or in the substrate 100 may be further included. In the case that the substrate 100 is a material having a semiconductor characteristic, the conductive region may be an impurity region formed in the substrate 100. In the case that the substrate 100 is an insulating material, the conductive region may be a conductive layer or a conductive pattern formed on the substrate 100. According to an embodiment, the conductive region may be used as a common source line.

Figure 5:
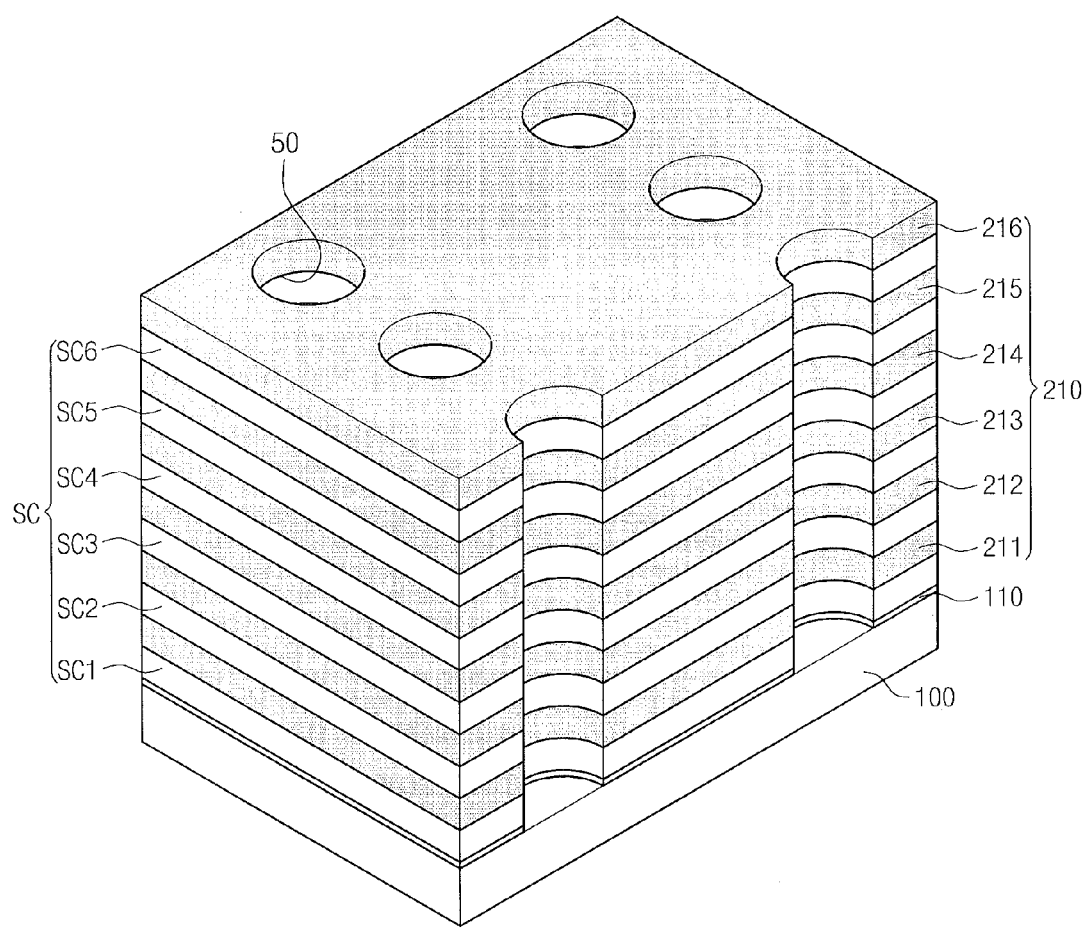

Referring to FIGS. 3 and 5, the thin layer structure is patterned to form a plurality of first penetration regions 50 exposing a top surface of the substrate 100 (S20). According to an embodiment, each of the penetration regions 50 may be formed to have a cylindrical hole shape or a rectangular parallelepiped hole shape. The penetration regions 50 may also have different widths according to a distance from the substrate 100. More specifically, forming the first penetration regions 50 may include forming a mask pattern (not illustrated) defining a plane location of the first penetration regions 50 on the thin layer structure and anisotropically etching the thin layer structure using the mask pattern as an etching mask. The first penetration regions 50 may be two-dimensionally and regularly formed. For example, locations of the first penetration regions 50 may be indicated by coordinate sets of (x0+n*a, y0+m*b) (here, x0 and y0 are coordinates of a reference point, n and m are natural numbers selected within a size of a cell array and a and b are constants).

Figure 6:
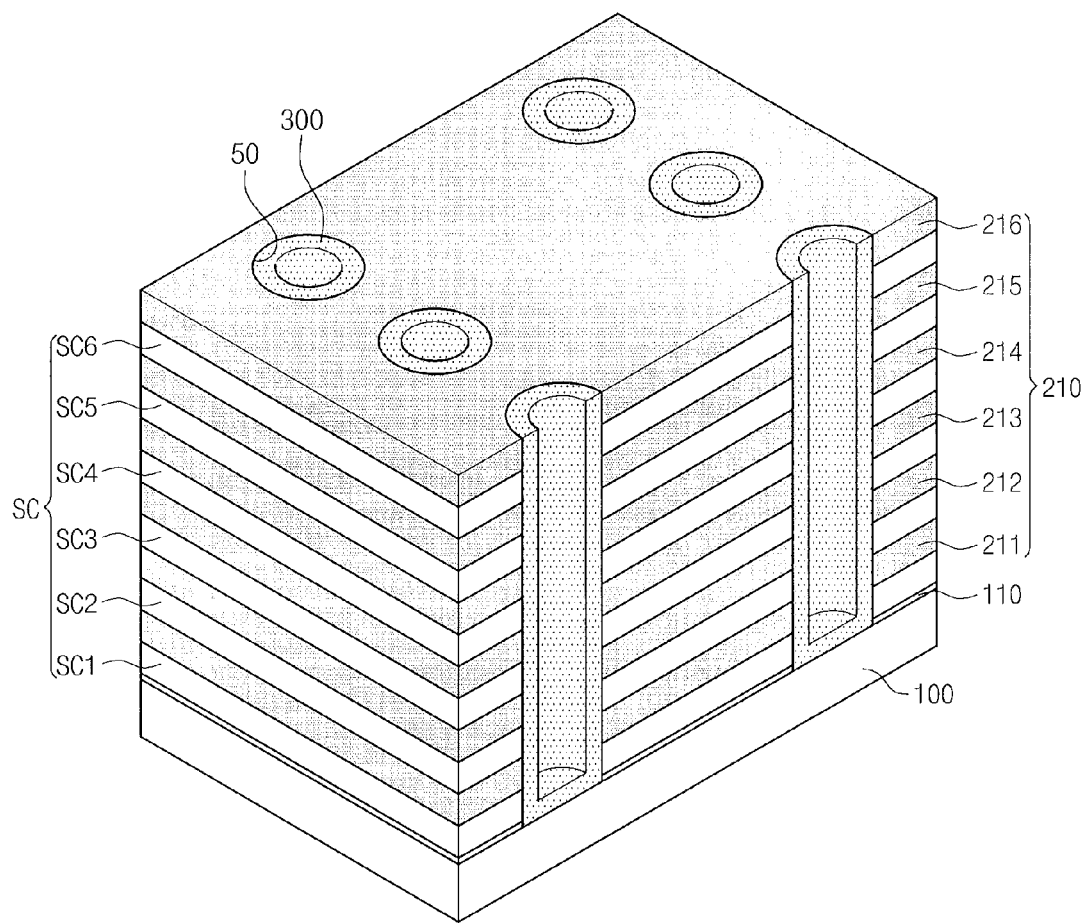

Referring to FIGS. 3 and 6, semiconductor layers 300 are formed in the first penetration regions 50 (S30). The semiconductor layer 300 may be formed to directly contact a top surface of the conductive region. The semiconductor layer 300 may be formed to substantially conformally cover inner walls of the first penetration regions 50. In this case, the semiconductor layer 300 may be formed to have a hollow cylindrical shape.

The semiconductor layer 300 may be one of semiconductor materials formed using an epitaxial technology or a chemical vapor deposition technology. A crystalline structure of the semiconductor layer 300 may be one of a multi-crystalline structure, a single crystalline structure and an amorphous structure. Also, a discontinuous interface in a crystalline structure may be formed between the substrate 100 and the semiconductor layer 300.

A width (i.e., a cell width) of the semiconductor layer 300 may be smaller than a width of a depletion region to be created therein or may be smaller than an average length of silicon grains constituting multi-crystalline silicon. If the width of the semiconductor layer 300 is substantially equal to a width of a depletion region to be created in the semiconductor layer 300, the semiconductor layer 300 may be completely depleted when a three-dimensional semiconductor memory device operates. As the width of the semiconductor layer 300 decreases, the width of the semiconductor layer 300 may be substantially equal to a width of a depletion region to be created in the semiconductor layer 300. In this case, a state of a back side (i.e., a side boarded a first buried pattern 310) of the semiconductor layer 300 used as a channel of a transistor increasingly affects a charge mobility. The semiconductor layers 300 are formed to have the same conductivity type as the substrate 100 which the semiconductor layers 300 contact. As a result, the semiconductor layers 300 do not form a diode with the substrate 100 and thereby the semiconductor layers 300 may have the same potential as the substrate 100.

Figure 7:
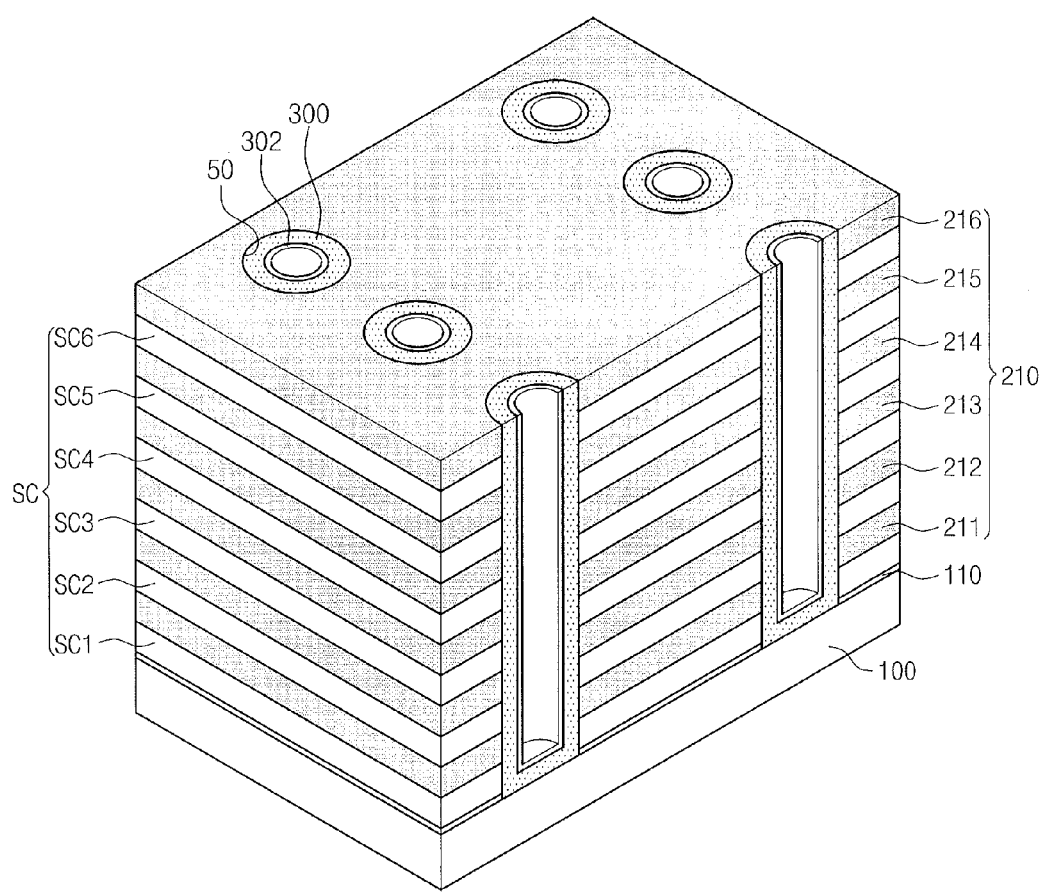
Figure 8:
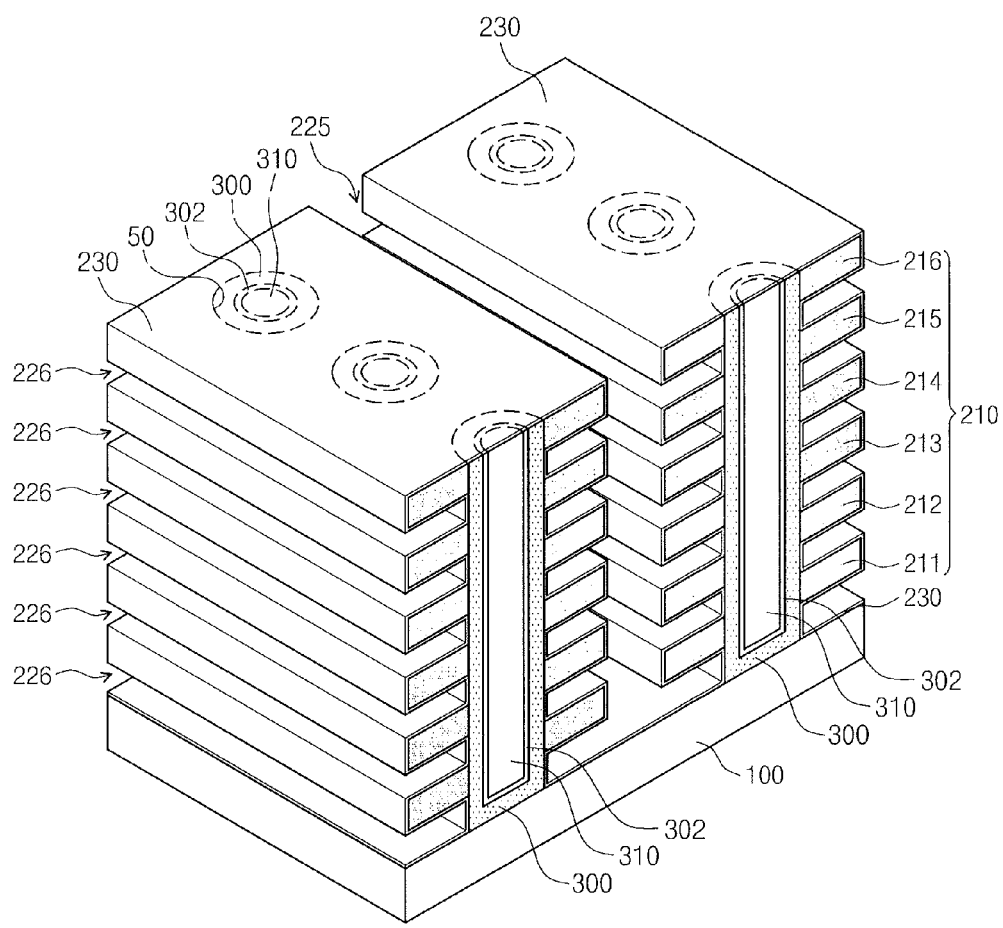

Referring to FIGS. 3, 7 and 8, a first buried pattern is formed inside the semiconductor layer 300 including a gap region therein (S50). The first buried pattern 310 may be formed to fill the first penetration region 50 in which the semiconductor layer 300 is formed and may include at least one among insulating materials. For example, the first buried pattern 310 may be a silicon oxide layer or an insulating material formed using a SOG (spin on glass) technology. That is, the first buried pattern 310 may be a CVD oxide layer, a PE oxide layer, a HDP oxide layer or a SOG layer. That is, the first buried pattern 310 may be formed by depositing a silicon oxide layer inside the semiconductor layer 300 using a reaction gas including a silicon atom (for example, $SiH_4$ gas) and a reaction gas including an oxygen atom (for example, $O_2$ gas). According to an embodiment, a hydrogen annealing step of treating a resultant structure in which the semiconductor layer 300 is formed may be further performed under the gas atmosphere including hydrogen or heavy hydrogen. The hydrogen annealing step may cure crystalline defects present in the semiconductor layer 300.

According to embodiments of the present inventive concept, an outer wall of the semiconductor layer 300 having a hollow cylindrical shape may be in contact with the thin layer structure exposed to the first penetration region 50 and an inner wall of the semiconductor layer 300 having a hollow cylindrical shape may be in contact with the first buried pattern 310 filling the first penetration region 50. In this case, a discontinuous interface in a crystalline structure may be formed between the first buried pattern 310 and the semiconductor layer 300. A large amount of defects may be present in an interface between the first buried pattern 310 including a silicon oxide layer and the semiconductor layer 300 including a polysilicon. For example, many defects such as a weak bonding between silicon atoms, a strained bonding between a silicon atom and an oxygen atom and a dangling bonding of a silicon atom may be present. That is, crystalline defects may be present at an interface where the first buried pattern 310 and the semiconductor layer 300 are in contact with each other and the interface may have a non-uniform morphology. Also, an interface trap density may increase due to a crystalline difference between the first buried pattern 310 and the semiconductor layer 300. The interface trap between the first buried pattern 310 and the semiconductor layer 300 may deteriorate a characteristic of the semiconductor layer 300 used as a channel.

Thus, before the first buried pattern 310 is formed, an inner wall of the semiconductor layer 300 is surface-treated (S40). The surface treatment process of the semiconductor layer 300 is to chemically combine a semiconductor atom present at a surface of the semiconductor layer 300 with an oxygen atom. As a result, an oxide passivation layer 302 may be formed on a surface of the semiconductor layer 300. That is, during the surface treatment process of the semiconductor layer 300, silicon atoms present on a surface of the semiconductor layer 300 are consumed to form a silicon oxide layer. When the first buried pattern 310 filling the gap region of the semiconductor layer 300 is formed, an interface trap density between the semiconductor layer 300 and an oxide layer can be reduced by performing the surface treatment process of the semiconductor layer 300. More specifically, a thermal oxidation process or a radical oxidation process may be performed as the surface treatment process of the semiconductor layer 300.

A dry thermal oxidation process forming an oxide layer at a high temperature using $O_2$ gas, $O_2/N_2$ gas or $O_2/N_2O$ gas or a wet thermal oxidation process forming an oxide layer at a high temperature using $H_2/O_2$ or $H_2O$ may be performed as the thermal oxidation process. Also, the radical oxidation process can use an oxygen gas, a hydrogen gas and/or a hydrogen chloride gas as a source gas and activates the source gas in a radical state to react to the semiconductor layer 300. An oxidation reaction can actively occur on a surface of the semiconductor layer 300 and a uniform oxide passivation layer can be formed on an entire surface of the semiconductor layer 300 by the radical oxidation process.

Also, a gas including halogen can be added during an oxidation process of the semiconductor layer 300. The oxide passivation layer 302 including halogen may be formed by oxidizing the semiconductor layer 300 under the atmosphere including halogen. At least one selected from a group consisting of $HCl$, $HF$, $NF_3$, $HBr$, $Cl_2$, $ClF_3$, $BCl_3$, $F_2$ and $Br_2$ may be used as a gas including halogen. In the case that the oxide passivation layer includes a halogen element, defects on a surface of the semiconductor layer 300 may be gettered by the halogen element.

The oxide passivation layer 302 may be formed on an inner side (i.e., a back side of a channel) of the semiconductor layer 300 through the surface treatment process. The oxide passivation layer 302 formed by the surface treatment process can reduce or remove defects present on a surface of the semiconductor layer 300. That is, an interface trap density between the semiconductor layer 300 and the first buried pattern 310 can be reduced by the surface treatment process. Therefore, when a three-dimensional semiconductor memory device operates, charge mobility in the semiconductor layer 300 used as a channel can be improved.

Figure 9:
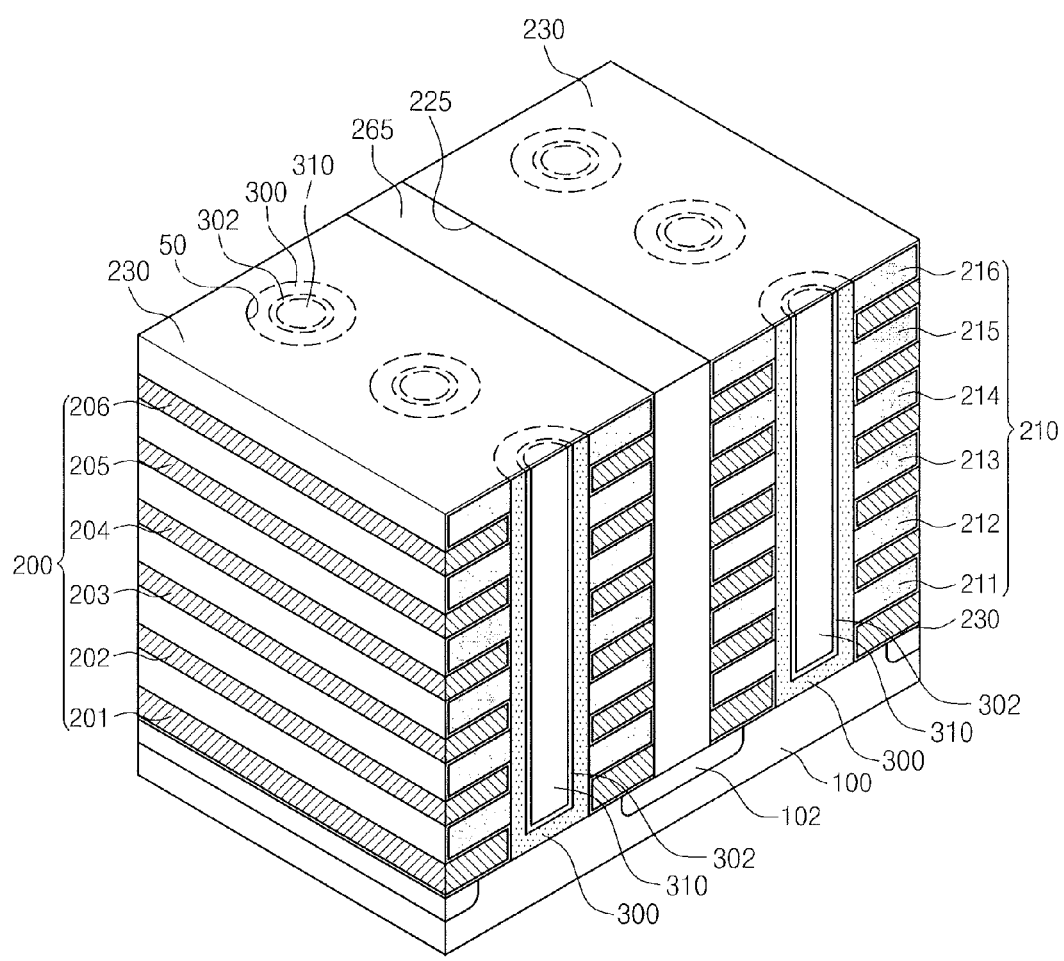

Referring to FIGS. 3, 8 and 9, a horizontal interconnection structure 200 is formed, which forms conductive patterns 201~206 sequentially stacked facing a sidewall of the semiconductor layer 300. Forming the horizontal interconnection structure 200 may include forming a second penetration region 225 penetrating a portion or an entire portion of thin layers constituting the thin layer structure between the semiconductor layers 300 (S60) and replacing sacrificial layers of the thin layer structure with conductive material layers (S70).

More specifically, as illustrated in FIG. 8, the second penetration region 225 may be formed to expose side walls of the sacrificial structure SC and the insulating layer structure 210. The second penetration region 225 is spaced apart from the semiconductor layer 300. The second penetration region 225 may be formed to have a line shape or a rectangular shape from a viewpoint of a horizontal shape. The second penetration region 225 may be formed to expose a top surface of the substrate 100 from a viewpoint of a vertical depth. According to a modified embodiment, the conductive region (not illustrated) which can be used as a common source line may be partly formed in the substrate 100 of a lower portion of the second penetration region 225. The conductive region may be formed through an ion implantation process using the thin layer structure in which the second penetration region 225 is formed as an ion mask.

The replacement step (S70) may include a step that after the sacrificial layers SC of which side walls are exposed by the second penetration region 225 are selectively removed to form recessed regions 226 between the insulating layers 210, a data storage layer 230 and the conductive patterns 201~206, as illustrated in FIG. 9, are formed in each of the recessed regions 226.

The recessed regions 226 may be gap regions horizontally extending between the insulating layers 210 from the second penetration region 225 and may be formed to expose sidewalls of the semiconductor layers 300. Forming the recessed regions 226 may include isotropically etching the sacrificial layers SC using an etching recipe having an etching selectivity with respect to the insulating layers 210. For example, if the sacrificial layers SC are a silicon nitride layer and the insulating layers 210 are a silicon oxide layer, the etching may be performed using an etching solution including phosphorous.

Forming the data storage layer 230 and the conductive patterns 201~206 may include forming the data storage layer 230 and a conductive layer sequentially covering the second penetration regions 225 and the recessed regions 226 and leaving the conductive patterns 201~206 in the recessed regions 226 by removing the conductive layer in the second penetration region 225. Subsequently, as illustrated in FIG. 9, an electrode separation pattern 265 filling the second penetration region 225 may further be formed. Conductive patterns 201~206 may constitute a horizontal interconnection structure 200.

The data storage layer 230 may be formed using a deposition process capable of providing a superior step difference coating ability such as a chemical vapor deposition or an atomic layer deposition. The data storage layer 230 may be formed to a thickness smaller than half of a thickness of the recessed region 226. Thus, the data storage layer 230 may be formed to substantially conformally cover a resultant structure in which the recessed regions 226 are formed. According to an embodiment of the present inventive concept for a flash memory, the data storage layer 230 may include a charge storage layer. For example, the data storage layer 230 may include one of a trap insulating layer, a floating gate electrode and an insulating layer including conductive nano dots. According to an embodiment, the data storage layer 230 may further include a tunnel insulating layer and a blocking insulating layer. The tunnel insulating layer may include at least one of a silicon oxide layer and a silicon nitride layer, and the blocking insulating layer may include at least one of an aluminum oxide layer, a silicon oxide layer and a silicon nitride layer.

The conductive layer may be formed to fill the recessed regions 226 and the second penetration regions 225 covered with the data storage layer 230. The conductive layer may include at least one of tungsten, metal nitrides, metal silicides and silicon that are doped. Since the technical sprit of the present inventive concept is not limitedly applied to a flash memory device, the data storage layer 230 and the conductive layer may be formed of various materials and may have various structures.

Removing the conductive layer in the second penetration region 225 may include anisotropically etching the conductive layer using the top insulating layer SC constituting the thin layer structure or a hard mask pattern (not illustrated) additionally formed thereof as an etching mask. In the case that the conductive layer is removed in the second penetration region 225, the conductive layer forms conductive patterns 201~206 that are vertically separated from one another. That is, the conductive patterns 201~206 may be partly formed in the recessed regions 226 and may constitute the horizontal interconnection structure 200.

Forming the electrode separation pattern 265 may include filling the second penetration region 225 in which the conductive layer is removed with at least one of insulating materials. According to an embodiment, the electrode separation pattern 265 may be at least one of a silicon oxide layer, a silicon nitride layer and a silicon oxynitride layer.

According to an embodiment, before the electrode separation pattern 265 is formed, an impurity region 102 may be formed in the substrate 100. The impurity region 102 may be formed to have a different conductivity type from the substrate 100. In this case, the impurity region 102 may be used as the common source line (CSL) described with reference to FIG. 2.

Figure 10:
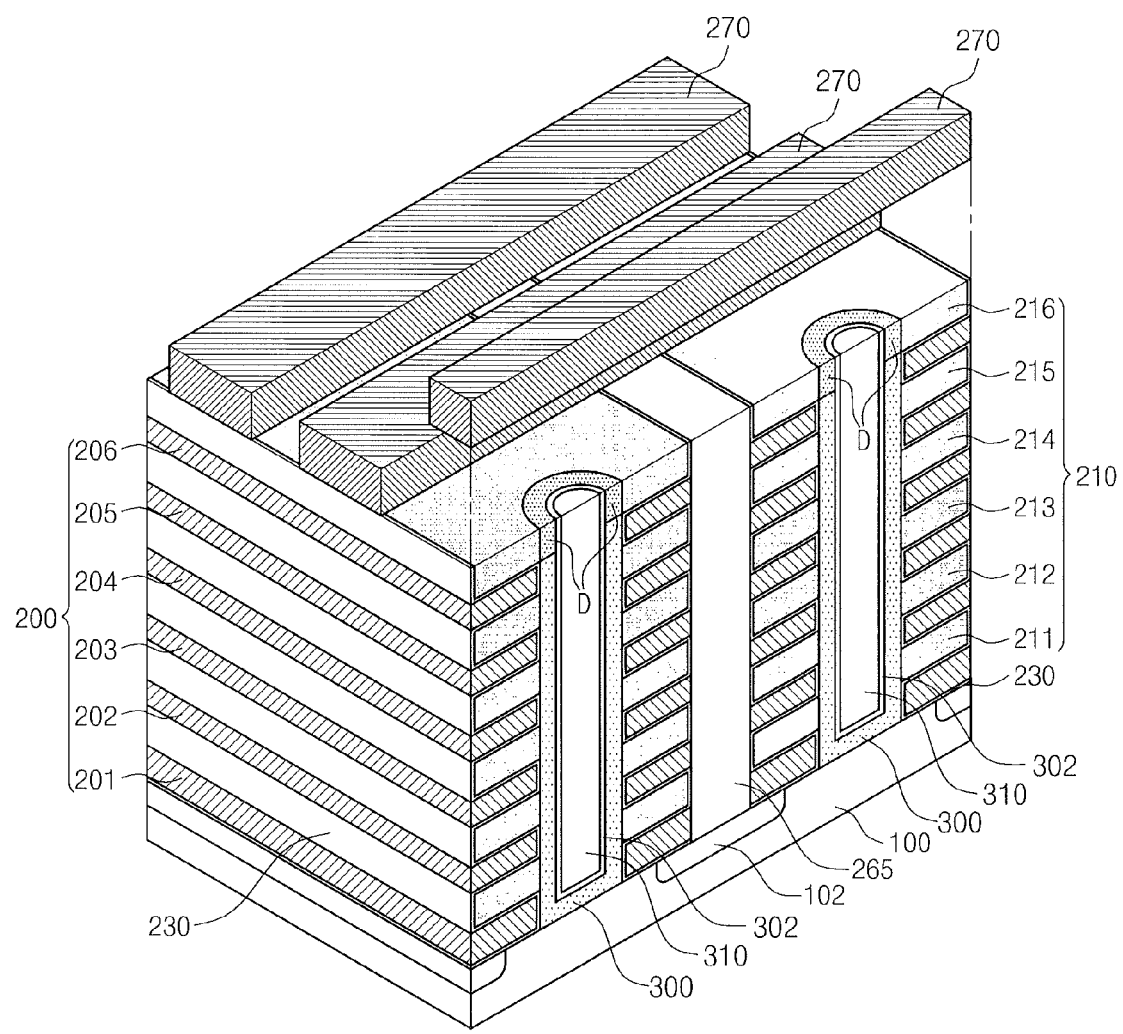

Referring to FIG. 10, a contact pad D may be formed on upper portions of the first buried pattern 310 and the semiconductor layer 300. Bit lines BL electrically connecting the semiconductor layers 300 to one another may be formed. The bit lines BL may be formed along a direction crossing the second penetration region 225 and the horizontal interconnection structure 200 as illustrated in FIG. 10. The bit lines BL may be connected to the semiconductor layers 300 by a contact plug (not illustrated).

Figure 11:
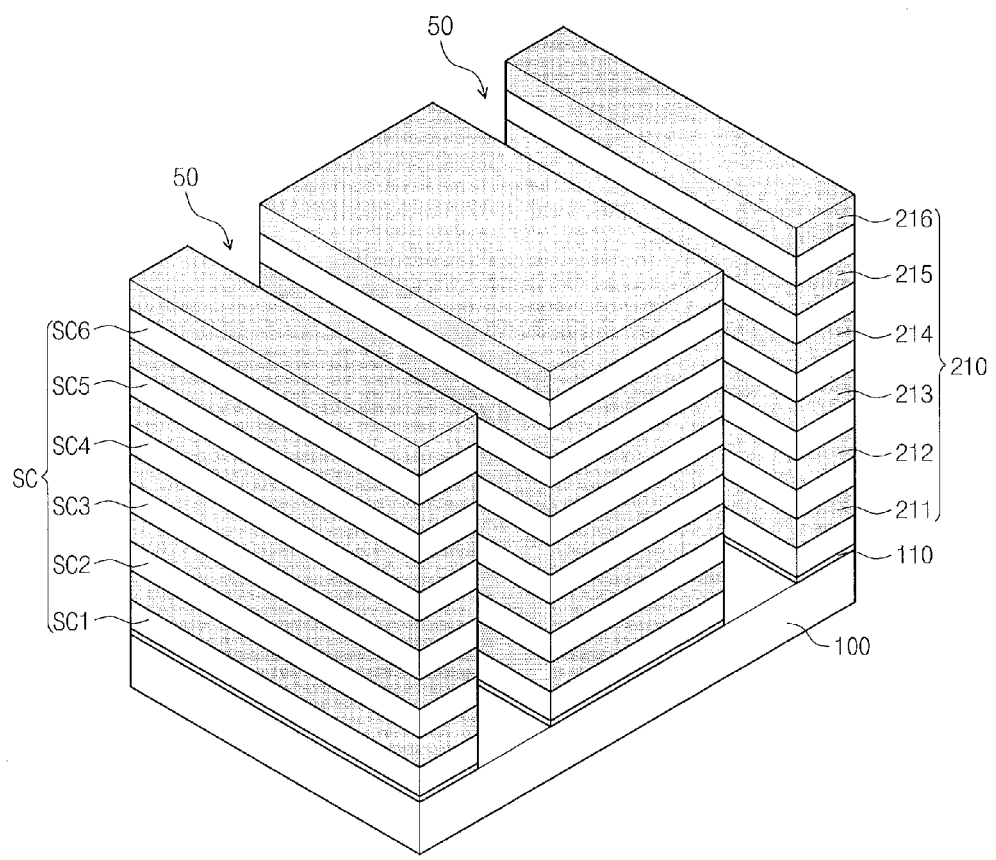
FIGS. 11 through 15 are views sequentially illustrating a method of manufacturing a three-dimensional semiconductor memory device in accordance with another embodiment of the present inventive concept.

Hereinafter, referring to FIGS. 3 and 11 through 15, a method of manufacturing a three dimensional semiconductor memory device in accordance with another embodiment of the present inventive concept will be described in detail. FIGS. 11 through 15 are views sequentially illustrating a method of manufacturing a three-dimensional semiconductor memory device in accordance with another embodiment of the present inventive concept. Referring to FIGS. 3 and 11, a thin layer structure is formed, and then the thin layer structure is patterned to form first penetration regions 50 exposing a top surface of a substrate 100. According to this embodiment, each of the first penetration regions 50 may be formed to have a line shape or a stripe shape. Also, the first penetration region 50 may have different widths according to a distance from the substrate 100.

Figure 12:
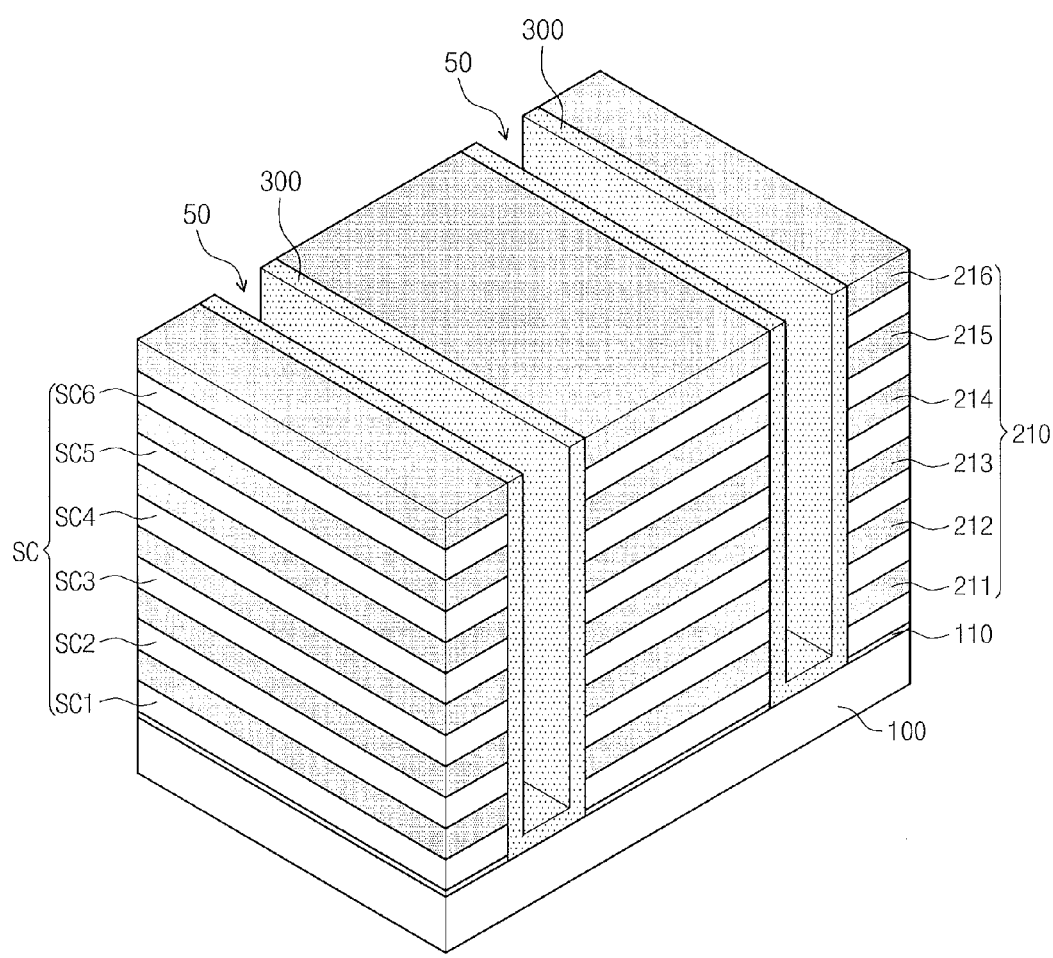

Referring to FIGS. 3 and 12, a semiconductor layer 300 covering an inner wall of the first penetration region 50 is formed. According to this embodiment, the semiconductor layer 300 may be formed to conformally cover the inner wall of the first penetration region 50 using a chemical vapor deposition process. That is, semiconductor layer 300 may cover an inner wall of the first penetration region 50 formed in a line shape and may have a gap region therein.

Figure 13:
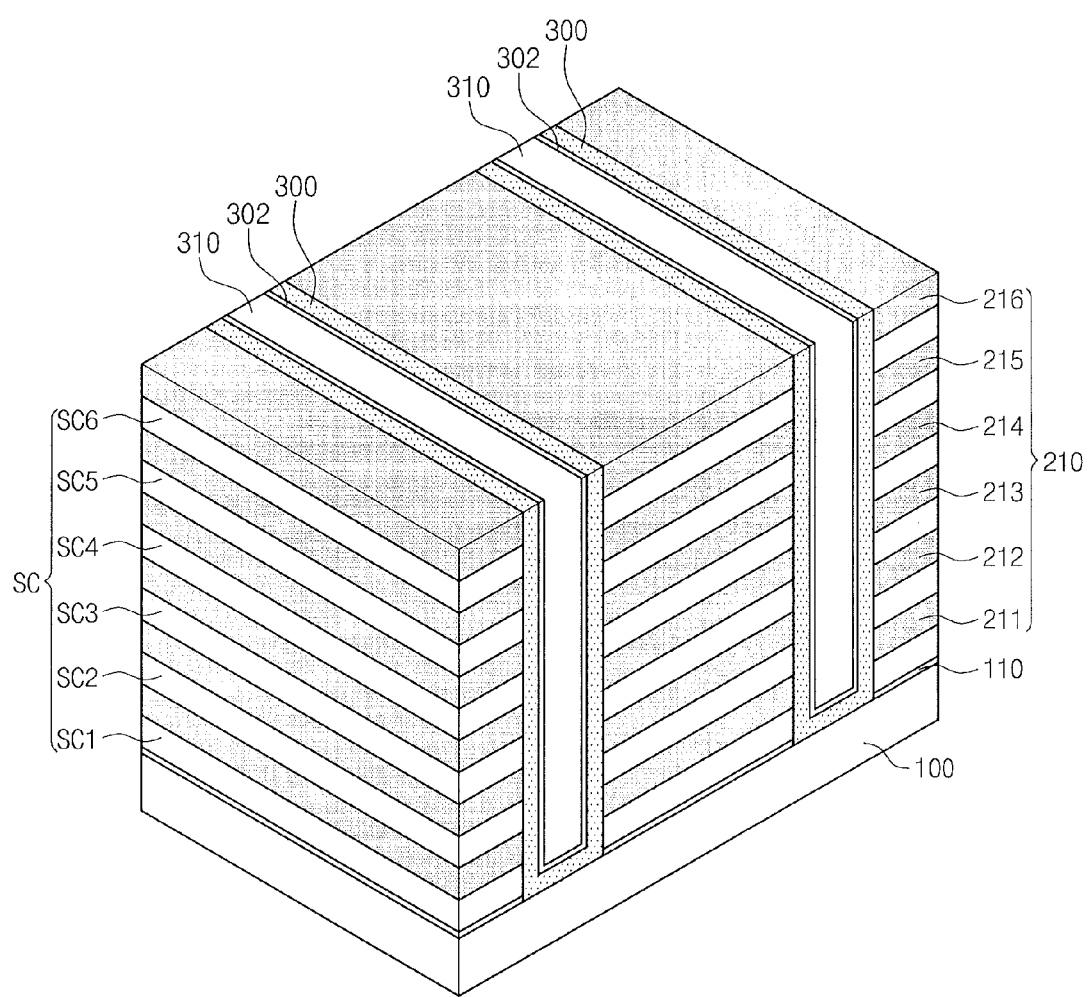

Referring to FIGS. 3 and 13, an inner sidewall of the semiconductor layer 300 is surface-treated and a first buried pattern 310 is formed in the gap region of the semiconductor layer 300. That is, the inner sidewall of the semiconductor layer 300 exposed to the first penetration region 50 is oxidized to form an oxide passivation layer 302. The oxide passivation layer 302 may be formed by making silicon atoms of the semiconductor layer 300 formed of polysilicon react to oxygen atoms provided from the outside. After that, the first buried pattern 310 may be formed by depositing a silicon oxide layer inside the semiconductor layer 300 using a reaction gas providing a silicon atom (for example, $SiH_4$ gas) and a reaction gas providing an oxygen gas (for example, $O_2$ gas).

Figure 14:
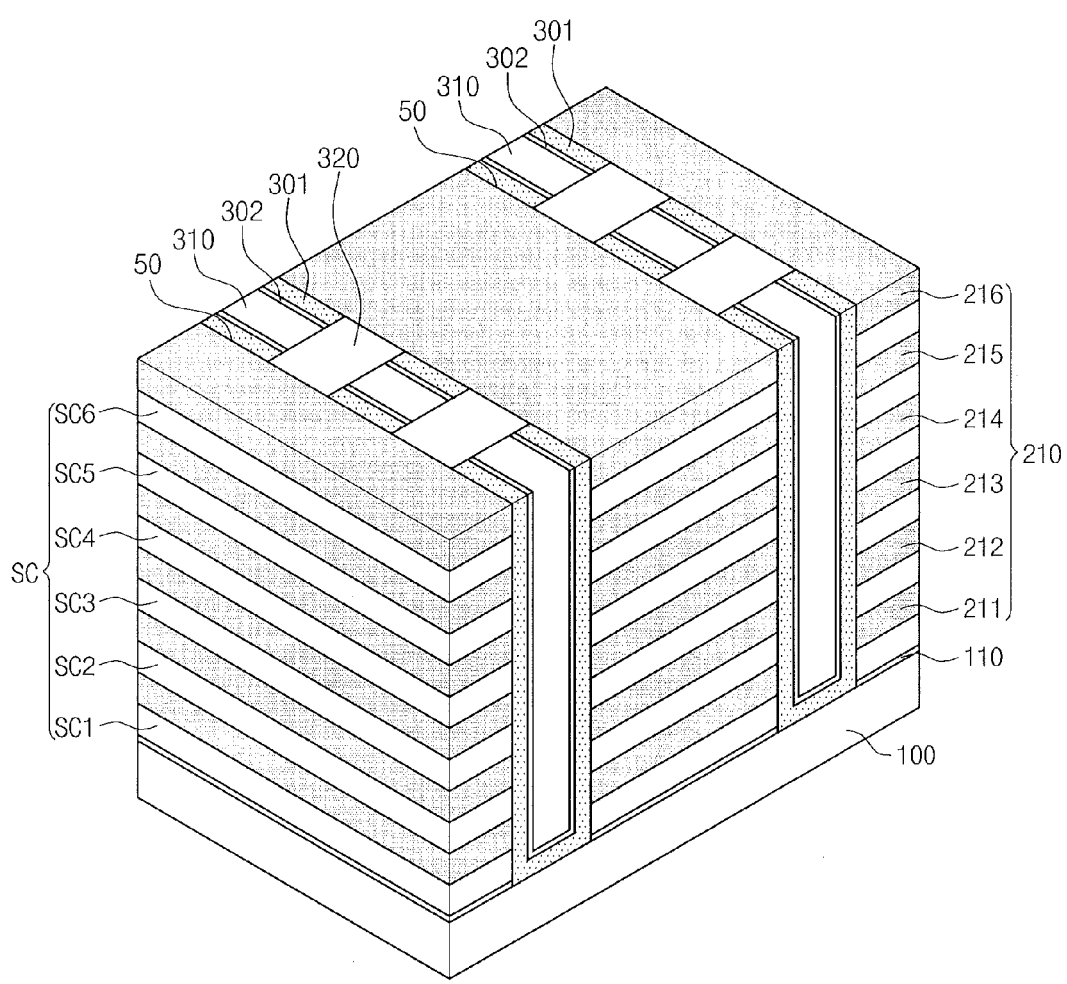

Referring to FIG. 14, after the first buried patterns 310 are formed, the semiconductor layer 300 is patterned to form a plurality of semiconductor patterns 301 separated from one another in the first penetration region. After the plurality of semiconductor patterns 301 is formed, second buried patterns 320 filling spaces between the semiconductor patterns 301 may further be formed. Forming the semiconductor patterns 301 may include exposing the inner wall of the semiconductor layer 300 by patterning the first buried patterns 310 using etching mask patterns crossing a major axis of the first penetration regions 50 and etching the exposed inner wall of the semiconductor layer 300 to horizontally separate the semiconductor patterns 301 from one another.

The second buried pattern 320 may be formed of at least one of insulating materials. According to an embodiment, forming the second buried patterns 320 may include a step that after the second buried layer filling the spaces between the separated semiconductor patterns 301 are formed, the second buried layer and the semiconductor patterns 301 are planarized down to expose a top surface of the thin layer structure. In this case, the semiconductor patterns 301 are node-separated to be partly formed in the first penetration region 50 and the second buried pattern 320.

After that, a process of forming a horizontal interconnection structure is performed. The horizontal interconnection structure may form conductive patterns 201~206 that are sequentially stacked facing sidewalls of the semiconductor patterns 301. The process of forming a horizontal interconnection structure may include forming second penetration regions 225 penetrating a portion or an entire portion of the thin layer constituting the thin layer structure between the semiconductor patterns 301 (S360) and replacing the sacrificial layers SC of the thin layer structure with conductive material layers (S70).

Forming the second penetration regions 225(S160) may be performed using the same method as that of the embodiment described with reference to FIGS. 8 and 9. Also, in the step (S70) of replacing the sacrificial layers SC with the conductive material layers, the recessed regions 226 may be filled with the data storage layer 230 and the conductive patterns 201~206 and the conductive patterns 201~206 may be spatially separated from one another by an electrode separation pattern 265 filling the second penetration region 225. Also, according to an embodiment, before the electrode separation pattern 265 is formed, an impurity region 102 may be formed in the substrate 100. The impurity region 102 may be formed to have a different conductivity type than the substrate 100 and may be used as the common source line CSL described with reference to FIG. 2.

Figure 15:
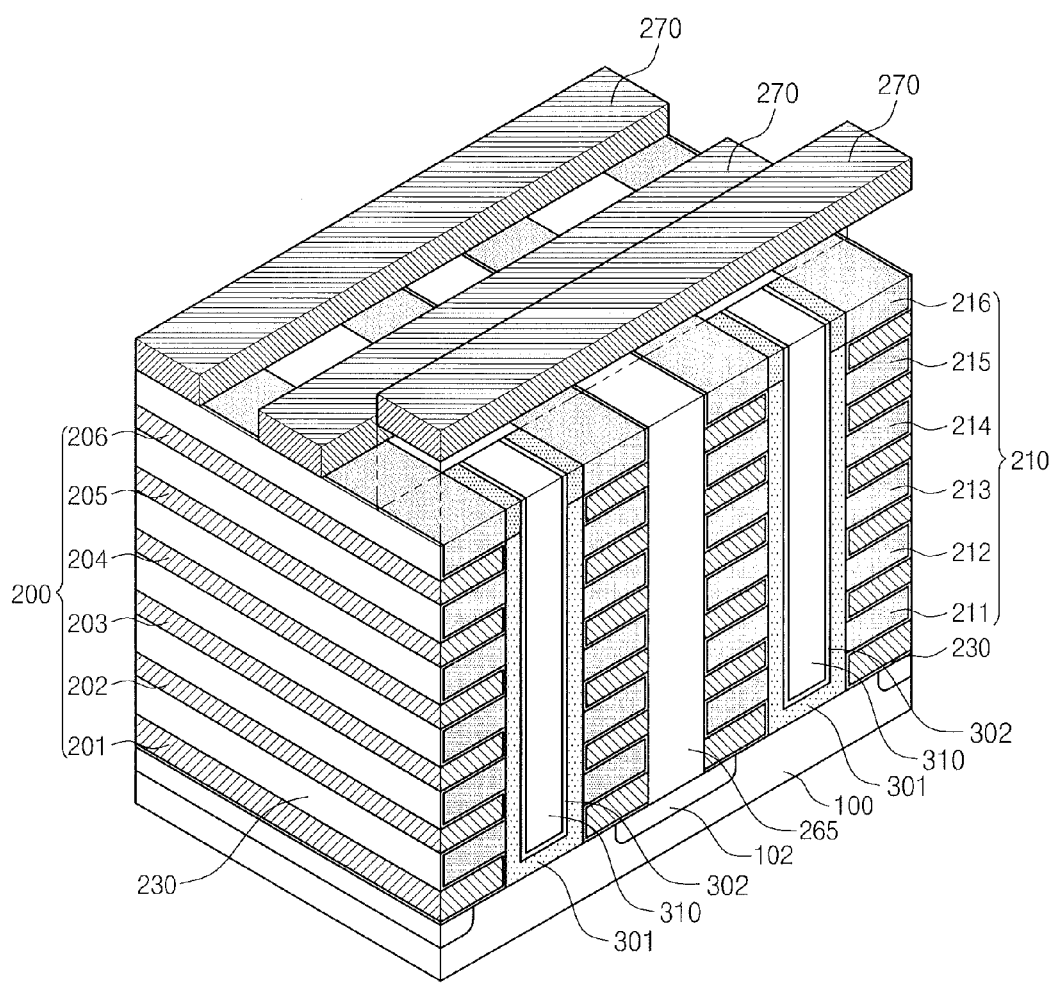

Referring to FIG. 15, a contact pad D may be formed on upper portions of the first buried pattern 310 and the semiconductor pattern 301. After that, bit lines 270 electrically connected to the semiconductor patterns 301 are formed. Forming the bit lines 270 may include a step that a conductive layer is deposited on an upper portion of the horizontal interconnection structure 200, and then the conductive layer is patterned in a line shape. The bit lines 270 may be formed to cross the conductive patterns 201~206. The bit lines 270 may directly contact the semiconductor pattern 301 or may be connected to the semiconductor pattern 301 through a contact plug.

Figure 16:
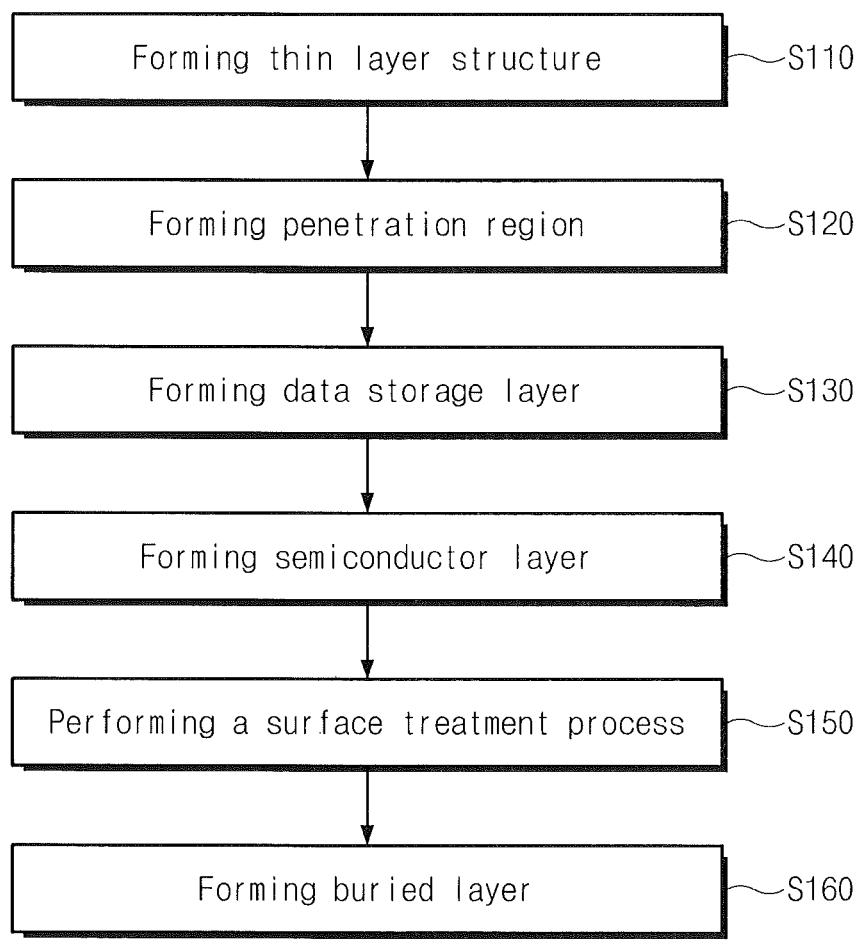
FIG. 16 is a flow chart illustrating a method of manufacturing a three-dimensional semiconductor memory device in accordance with another embodiment of the present inventive concept.
Figure 17:
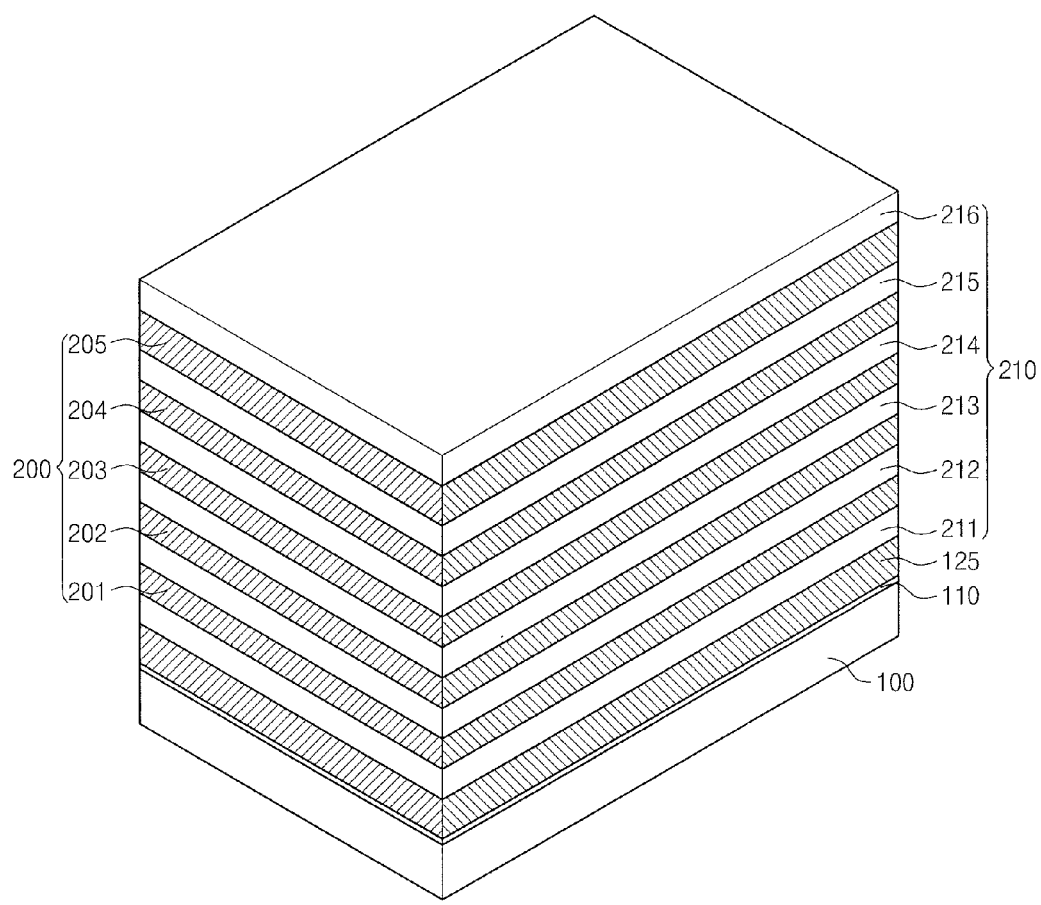
FIGS. 17 through 21 are views sequentially illustrating a method of manufacturing a three-dimensional semiconductor memory device in accordance with another embodiment of the present inventive concept.

Hereinafter, referring to FIGS. 16 through 21, a method of manufacturing a three-dimensional semiconductor memory device in accordance with another embodiment will be described in detail. FIG. 16 is a flow chart illustrating a method of manufacturing a three-dimensional semiconductor memory device in accordance with another embodiment of the present inventive concept. FIGS. 17 through 21 are views sequentially illustrating a method of manufacturing a three-dimensional semiconductor memory device in accordance with another embodiment of the present inventive concept. Referring to FIGS. 16 and 17, a lower gate insulating layer 110 and a lower gate layer 125 are sequentially formed on the substrate 100. The substrate 100 may include a cell array region in which memory cells are formed and a peripheral circuit region in which peripheral circuits are formed for operating the memory cells.

The lower gate insulating layer 110 may be a silicon oxide layer formed by a thermal oxidation process and may be formed to a thickness of about 40 angstroms to 300 angstroms. A flash memory device may include a gate insulating layer having various thicknesses and various materials and methods of forming the gate insulating layer are well established. The lower gate insulating layer 110 may be formed using at least one of the announced technologies of forming a gate insulating layer of a flash memory device. The lower gate layer 125 is formed of at least one of conductive materials so as to be used as a gate electrode. For example, the lower gate layer 125 may be formed of conductive material such as doped polysilicon. The lower gate layer 125 and the lower gate insulating layer 110 may be used as a ground select line (GSL) and a capacitor dielectric layer CD, respectively.

A thin layer structure is formed on the lower gate layer 125 using the same method as that described with reference to FIG. 3. According to this embodiment, the thin layer structure may be formed by alternately stacking upper gate layers 201, 202, 203, 204 and 205 and interlayer insulating layers 211, 212, 213, 214, 215 and 216. Here, the upper gate layers 201, 202, 203, 204 and 205 separately stacked from one another by the interlayer insulating layers 211, 212, 213, 214, 215 and 216 constitute an upper gate structure 200 and the interlayer insulating layers 211, 212, 213, 214, 215 and 216 interposed between the upper gate layers 201, 202, 203, 204 and 205 constitute an interlayer insulating structure 210.

According to the present inventive concept, the upper gate layers 201~205 may be used as word line planes (WL_PT) or string select lines (SSL). As described before, a space (i.e., a thickness of the interlayer insulating layers 211~216) between the upper gate layers 201~205 may be formed to have a range smaller than a maximum width of an inversion region formed in a semiconductor layer 300. Also, the upper gate layers 201~205 may be formed of at least one (for example, doped polysilicon) of conductive materials so as to be used as a gate electrode.

Since the upper gate layers 210~205 are used as a gate of a memory cell transistor in accordance with the present inventive concept, a thickness of the upper gate layers 210~205 determines a channel length of the memory cell transistor. Since the upper gate layers 210~205 are formed by a deposition process, a channel length may be more precisely controlled compared with a case that the upper gate layers 210~205 are formed by a patterning process. Also, a length direction of a channel of the memory cell transistor is perpendicular to the substrate 100, an integration of the semiconductor memory device in accordance with the present inventive concept is independent of a thickness of the upper gate layers 201~205. Thus, the upper gate layers 201~205 may be selected in the range that can prevent a technical problem in accordance with an short channel effect.

The interlayer insulating layers 211~216 may be formed by a silicon oxide layer. A formation of an inversion region due to an electric potential applied to the upper gate layers 201~205 may be controlled by a fringe field due to a voltage applied to gate conductive layers. The interlayer insulating layers 211~216 may further include high dielectric layers to easily form the inversion region. The high dielectric layer may be one (for example, a silicon nitride layer, a silicon oxynitride layer) of high dielectric layers having a dielectric constant higher than a silicon oxide layer. The upper gate layers 201~205 and the lower gate pattern 125 constitute gate conductive layers.

The number of the thin layers, a thickness of each of the thin layers and material of each of the thin layers that constitute the upper gate structure 200 and the gate interlayer insulating structure 210 may be diversely changed considering an electrical characteristic of the memory cell transistor and technical difficulties in a process of patterning the thin layers.

Figure 18:
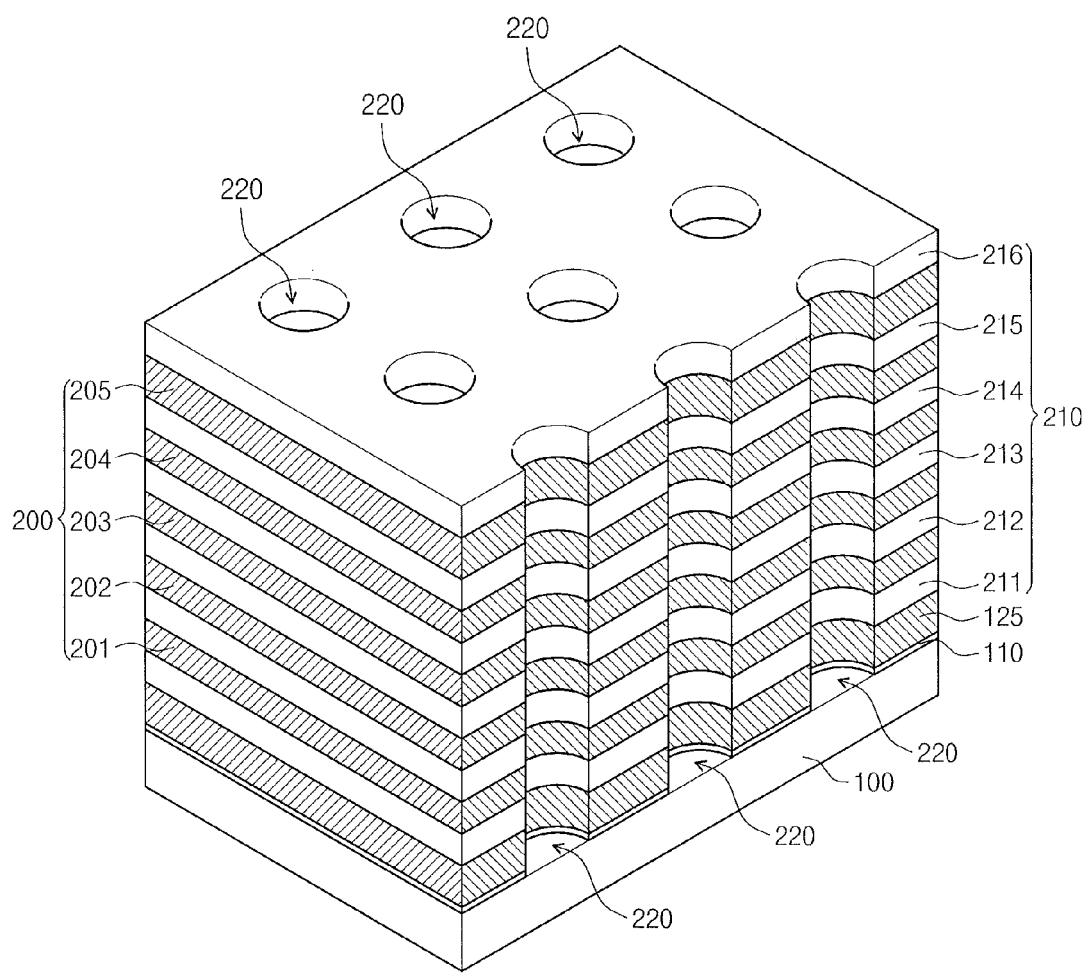

Referring to FIGS. 16 and 18, the upper gate structure 200, the gate interlayer insulating structure 210 and the lower gate pattern 125 are patterned to form penetration regions 220 exposing a top surface of the substrate 100 in the cell array region (S120). In the case that sidewalls of the penetration regions 220 are formed to be inclined, since a channel width of the memory cell transistors becomes different, non-uniformity in an electrical characteristic of the memory cells may occur. To minimize the non-uniformity, a patterning process for forming the penetration regions 220 may be performed using an anisotropic etching technology so that the penetration regions 220 may have sidewalls perpendicular to the substrate 100. According to a modified embodiment, the upper gate layers 201~205 may be formed to have different thicknesses from one another to improve uniformity of an electrical characteristic between the cells.

Figure 19:
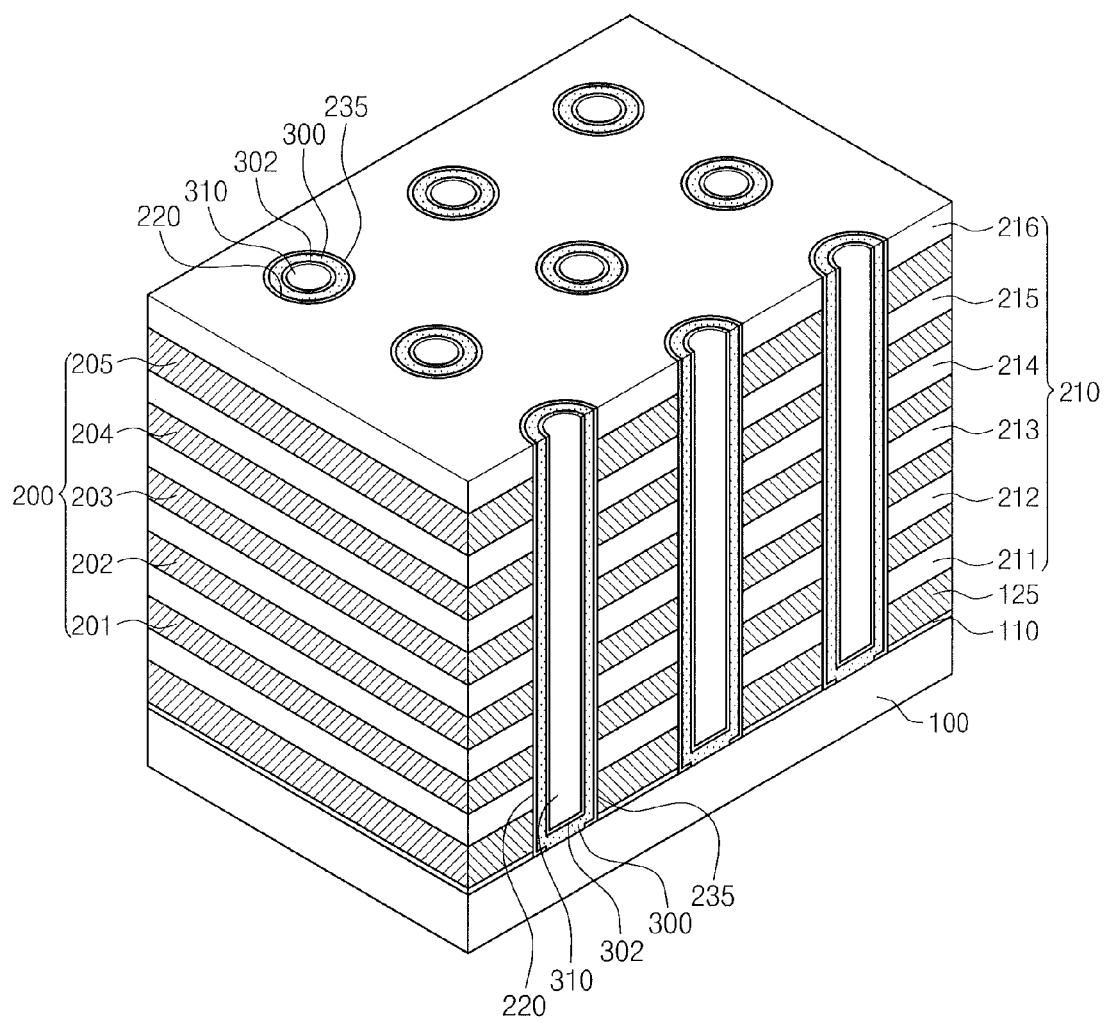

Referring to FIGS. 16 and 19, a gate insulating layer 235 (i.e., an information storage device) is conformally formed on a resultant structure in which the penetration regions 220 are formed (S130). The gate insulating layer 235 may be at least one of a silicon oxide layer, a silicon nitride layer and a silicon oxynitride layer and may be formed by one of the announced insulating materials used as a gate insulating layer.

According to an embodiment of the present inventive concept, the gate insulating layer 235 may include a thin layer for storing information. For example, the gate insulating layer 235 may include a blocking insulating layer, a charge storage layer and a tunnel insulating layer that are sequentially stacked. The charge storage layer may be a silicon nitride layer or a silicon oxynitride layer including charge trap sites and may be used as a thin layer for storing information. The tunnel insulating layer may be a thermal oxide layer or a chemical vapor deposition silicon oxide layer. The blocking insulating layer may include at least one of materials having a dielectric constant higher than the tunnel insulating layer. The blocking insulating layer, the charge storage layer and the tunnel insulating layer may be formed using the technologies disclosed in the published documents or using modified technologies.

As described above, the substrate 100 is electrically connected to semiconductor layers 300 filling the penetration regions 220. Since it is necessary to expose a top surface of the substrate 100, spacers are formed as an etching mask for patterning the gate insulating layer 235 in the penetration regions 220. The spacers are formed to cover an inner sidewall of the gate insulating layer 235 in the penetration region 220, thereby reducing an etching damage with respect to the gate insulating layer 235 in a subsequent patterning process etching the gate insulating layer 235.

According to an embodiment, the spacers may be one of materials which can be removed while minimizing an etching damage with respect to the gate insulating layer 235. For example, when the gate insulating layer 235 contacting the spacers is a silicon oxide layer, the spacers may be formed of a silicon nitride. According to a modified embodiment, the spacers may be formed of the same material as the semiconductor layer. For example, the spacers may be formed of amorphous silicon or polysilicon. In this case, the spacers may be used as the semiconductor layer 300 without an additional removing process.

Subsequently, the exposed gate insulating layer 235 is etched using the spacers as an etching mask. Accordingly, a top surface of the substrate 100 is exposed to bottoms of the penetration regions 220. At this time, an etching stop layer 160 may be removed during or before an etching of the gate insulating layer 235.

Subsequently, semiconductor layers 300 are formed in the penetration regions 220(S140). Before forming the semiconductor layers 300, the spacers are removed while minimizing an etching damage with respect to the gate insulating layer 235. The semiconductor layer 300 contacting the substrate 100 is formed on a bottom of the penetration region 220 while covering the gate insulating layers 235. The semiconductor layer 300 may be formed using one of chemical vapor deposition technologies. In this case, the semiconductor layer 300 may be formed of polysilicon or amorphous silicon and a discontinuous boundary in a crystalline structure may be formed between the substrate 100 and the semiconductor layer 300.

The semiconductor layer 300 may be formed to conformally cover the penetration region 220 in which the gate insulating layer 235 is formed. That is, the semiconductor layer 300 may be formed to have a hollow cylindrical shape or a shell shape and an inner space of the semiconductor layer 300 may be filled with an insulating material. A thickness of the semiconductor layer 300 (i.e., a thickness of the shell) may be smaller than a width of a depletion region to be formed therein or may be smaller than an average length of a silicon grain constituting polysilicon.

According to the present inventive concept, the semiconductor layer 300 is formed to have the same conductivity type as the substrate 100 which the semiconductor layer 300 contacts. As the result, the semiconductor layer 300 does not constitute a diode with the substrate 100 and thereby the semiconductor layer 300 may have the same potential as the substrate 100.

After the semiconductor layer 300 of a cylindrical shape is formed, a surface treatment process is performed on the semiconductor layer 300 (S150). A thermal oxidation process or a radical oxidation process may be performed as the surface treatment process of the semiconductor layer 300.

An oxide passivation layer 302 may be formed on an inner sidewall (i.e., a back side of a channel) of the semiconductor layer 300 through the surface treatment process. The oxide passivation layer 302 formed through the surface treatment process may reduce or remove defects present on a surface of the semiconductor layer 300.

After that, a first buried pattern 310 formed of an insulating material may be formed in the penetration region 220 in which the semiconductor layer 300 and the oxide passivation layer 302 are formed (S160). Since the oxide passivation 302 is formed between the first buried pattern 310 and the semiconductor layer 300, an interface trap density at an interface between the semiconductor layer 300 and the first buried pattern 310 may be reduced.

Figure 20:
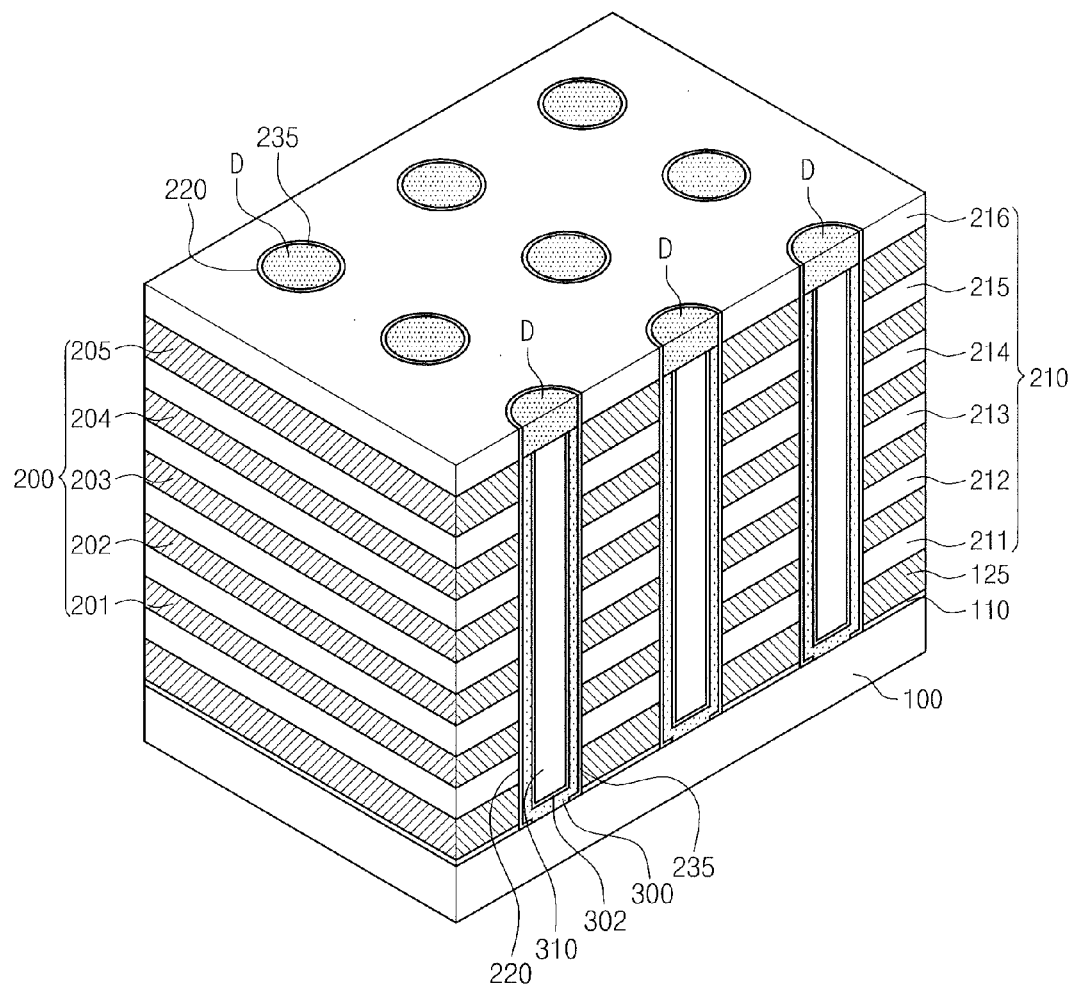
Figure 21:
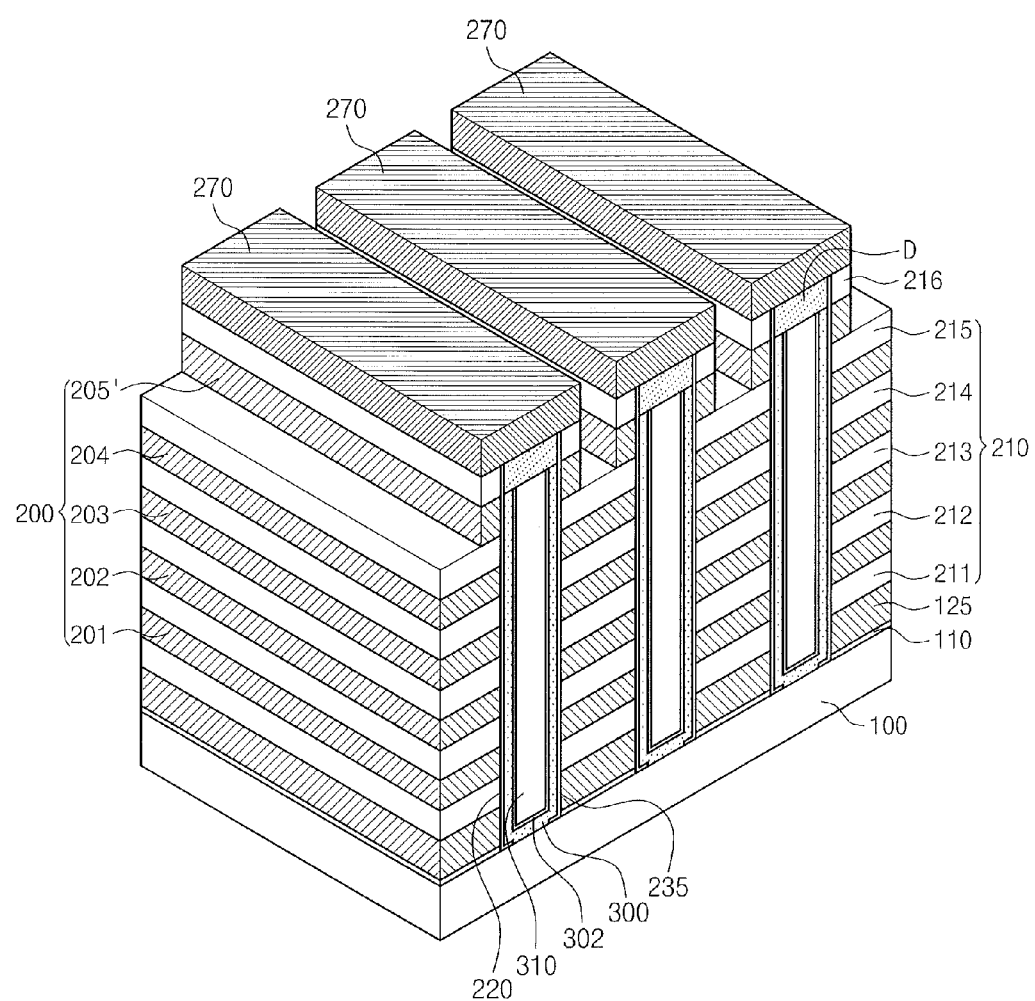

Referring to FIG. 20, drain regions D used as drain electrodes of cell strings are formed on upper regions of the semiconductor layers 300. Referring to FIG. 21, the most upper gate layer 205 is patterned to form string select lines 270. Each of the string select lines 270 is formed to one-dimensionally connect the semiconductor layers 300 to one another.

According to an embodiment, forming the string select lines 270 may include patterning the conductive layer 270, the most upper gate interlayer insulating layer 216 and the most upper gate layer 205 after the conductive layer 270 is formed on the drain regions D. The conductive layer 270 prevents the semiconductor layer 300 from being etching-damaged in a subsequent process and can directly contact upper regions (i.e., the drain region D) of the semiconductor layers 300. The conductive layer 270 may be formed of one of materials which can ohmic-contact the semiconductor layer 300 considering the direct contact.

Figure 22:
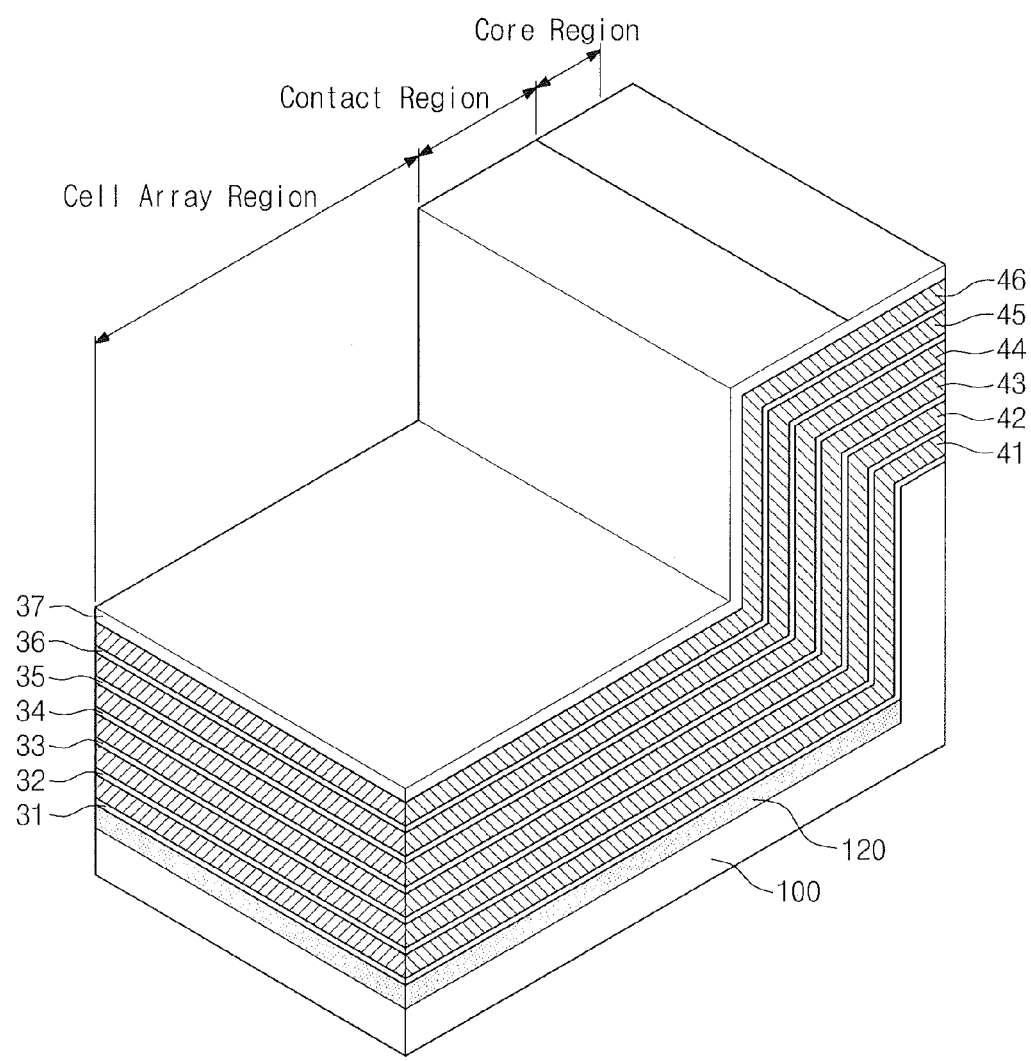
FIGS. 22 through 27 are views sequentially illustrating a method of manufacturing a three-dimensional semiconductor memory device in accordance with another embodiment of the present inventive concept.

Hereinafter, referring to FIGS. 16 and 22 through 27, a method of manufacturing a three-dimensional semiconductor memory device in accordance with another embodiment of the present inventive concept will be described in detail. FIGS. 22 through 27 are views sequentially illustrating a method of manufacturing a three-dimensional semiconductor memory device in accordance with another embodiment of the present inventive concept. Referring to FIG. 22, a substrate 100 including a cell array region and a core region is prepared. A top surface of the cell array region is formed to be lower than a top surface of the core region. According to an embodiment, that structure may be formed through a patterning step of recessing the substrate 100 in the cell array region. According to another embodiment, that structure may be formed through a step that after forming a predetermined thin layer having a thickness corresponding to a step difference between the cell array region and the core region, the thin layer is etched on the cell array region.

After that, as illustrated in FIG. 22, insulating layers 31, 32, 33, 34 and 35 and conductive layers 41, 42, 43 and 44 are sequentially and alternately deposited on the substrate 100. The insulating layers 31~35 and the conductive layers 41~44 may be conformally formed on the substrate 100. Whole thicknesses of the insulating layers 31~35 and the conductive layers 41~44 may be smaller than a step difference between the cell array region and the core region.

The insulating layers 31~35 may be a silicon oxide layer, a silicon nitride layer and a silicon oxynitride layer. Thicknesses of the insulating layers 32~34 interposed between the conductive layers 41~44 may be selected in the range of satisfying a technical characteristic for an overlap of inversion regions described in FIG. 1. However, since the most upper insulating layer 35 may be used as an etching mask in a subsequent patterning process, the most upper insulating layer 35 may be formed to have a thickness greater than the other insulating layers 31~34. In addition, the most lower insulating layer 31 may be formed to have a thickness greater than the other insulating layers 32~34 interposed between the conductive layers 41~44 to prevent a insulating breakdown between the most lower middle interconnection 141 of FIG. 23 and the substrate 100 or a lower impurity region 120.

The conductive layers 41~44 may include at least one of semiconductor, metal, metal nitride and metal silicide that are doped. As illustrated in FIG. 1, a memory cell transistor in accordance with embodiments of the present inventive concept has a vertical channel and thicknesses of the conductive layers 41~44 define a channel length of the memory cell transistor. In that respect, thicknesses of the conductive layers 41~44 may be selected in the range of satisfying a technical requirement (for example, prevention of a short channel effect) related to a channel length of the memory cell transistor.

According to an embodiment, before the insulating layers 31~35 and the conductive layers 41~44 are formed, a lower impurity region 120 may be formed in the cell array region of the substrate 100. The lower impurity region 120 may be formed to have a different conductivity type from the substrate 100 and in this case, may be used as the common source line CSL described with reference to FIG. 3.

Figure 23:
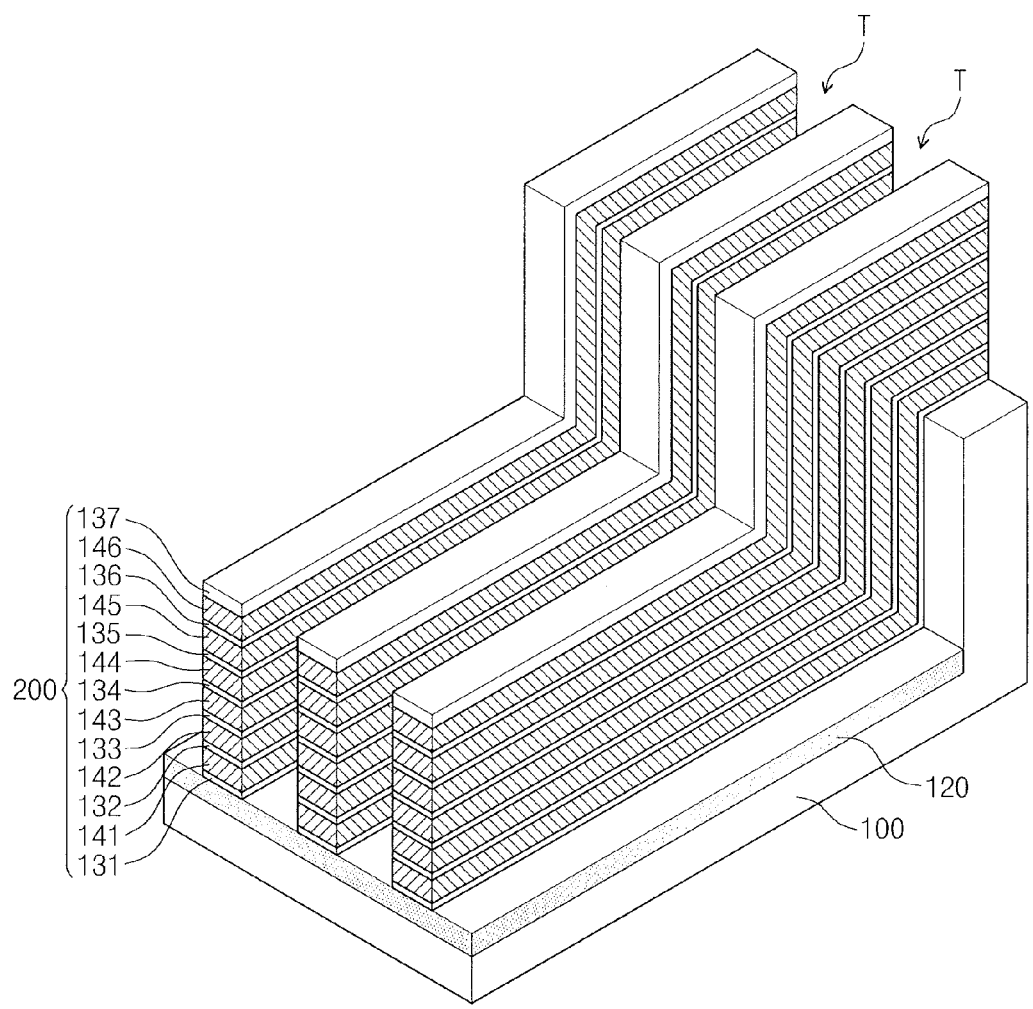

Referring to FIG. 23, the insulating layers 31~35 and the conductive layers 41~44 are patterned to form middle interconnection structures 200 defining trenches T exposing a top surface of the substrate 100. The middle interconnection structure 200 may be comprised of insulating layer patterns 131, 132, 133, 134 and 135 and the middle interconnections 141, 142, 143 and 144 formed by patterning the insulating layers 31~35 and the conductive layers 41~44. As illustrated in FIG. 23, side surfaces of the middle interconnections 141~144 and the insulating layer patterns 131~434 are exposed to define the trench T.

After patterning the most upper insulating layer 35 through a photolithography process and an etching process, the middle interconnection structures 200 may be formed by a patterning process using the most upper insulating layer 35 as a hard mask.

According to a modified embodiment, before forming the middle interconnection structures 200, in order to reduce a difficulty in a patterning due to a step difference between the cell array region and the core region, a step that after a separate mask layer for an etching mask is formed over an entire surface of the substrate 100, the resultant structure is planarized may be further comprised.

According to another modified embodiment, the middle interconnection structures 200 may be formed by performing a plurality of patterning processes. For example, the insulating layers 31~35 and the conductive layers 41~44 may be independently patterned in the core region and the cell array region. More specifically, the patterning may include a step that the thin layers are first patterned in the core region, and then after forming a mask layer covering the patterned core region, the cell array region is patterned.

Figure 24:
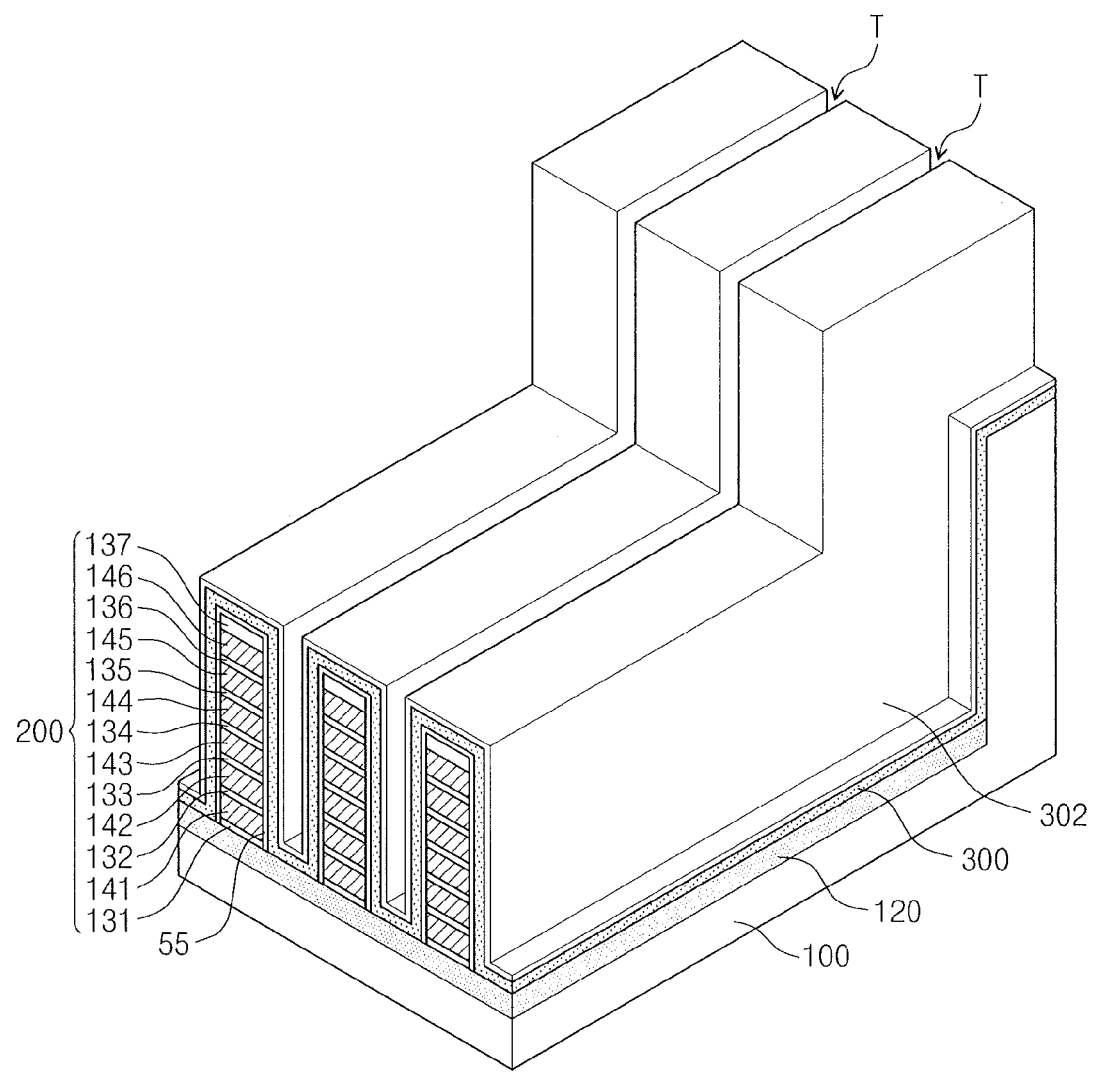

Referring to FIG. 24, after a data storage layer pattern 55 covering side surfaces of the middle interconnection structures 200 is formed, a semiconductor layer 300 is formed on the resultant structure.

The data storage layer pattern 55 may extend from the side surfaces of the middle interconnection structures 200 to cover top surfaces of the middle interconnection structures 200. According to this embodiment, the data storage layer pattern 55 may be formed to expose a top surface of the surface 100 on a bottom of the trench T. An etching process for removing the data storage layer pattern 55 may be further performed on the bottom of the trench T.

According to a modified embodiment, an etching process may be performed while covering the data storage layer pattern 55 with a predetermined protective layer in order to prevent a damage of the data storage layer pattern 55. For example, the semiconductor layer 300 may be formed through at least two deposition processes and the first deposited semiconductor layer may be used as a protective layer.

According to an embodiment, the data storage layer pattern 55 may include a charge storage layer. For example, the data storage layer pattern 55 may include a blocking insulating layer, a charge storage layer and a tunnel insulating layer that are sequentially stacked. The blocking insulating layer may include at least one of a silicon oxide layer, a silicon nitride layer, a silicon oxynitride layer and a high dielectric layer and may be comprised of a plurality of layers. Here, the high dielectric layer means insulating materials having a dielectric constant greater than a silicon oxide layer and may include a tantalum oxide layer, a titanium oxide layer, a hafnium oxide layer, a zirconium oxide layer, an aluminum oxide layer, an yittrium oxide layer, a niobium oxide layer, a cesium oxide layer, an indium oxide layer, an iridium oxide layer, a BST layer and a PZT layer. The tunnel insulating layer may be formed of material having a dielectric constant lower than the blocking insulating layer. The charge storage layer may be an insulating thin layer (for example, a silicon nitride layer) including abundant charge trap sites or may be an insulating thin layer including conductive particles. According to an embodiment, the tunnel insulating layer is a silicon oxide layer, the charge storage layer is a silicon nitride layer and the blocking insulating layer may be an insulating layer including an aluminum oxide layer.

The semiconductor layer 300 may be a single crystalline semiconductor or a polycrystalline semiconductor and may be formed using a vapor deposition technique or an epitaxial technique. The semiconductor layer 300, as illustrated in FIG. 24, may be formed to have conformal thickness or to substantially fill the trench T in which the data storage layer pattern 55 is formed. According to an embodiment, the semiconductor layer 300 may have a different conductivity type from the lower impurity region 120 so as to constitute a diode with the lower impurity region 120.

After the semiconductor layer 300 is formed, as described with reference to FIG. 7, the semiconductor layer 300 is surface-treated (S150). A thermal oxidation process or a radical oxidation process may be performed as a surface treatment process of the semiconductor layer 300.

The oxide passivation layer 302 may be formed on an inner side (i.e., a back side of a channel) of the semiconductor layer 300 through the surface treatment process. The oxide passivation layer 302 formed by the surface treatment process can reduce or remove defects present on a surface of the semiconductor layer 300.

Figure 25:
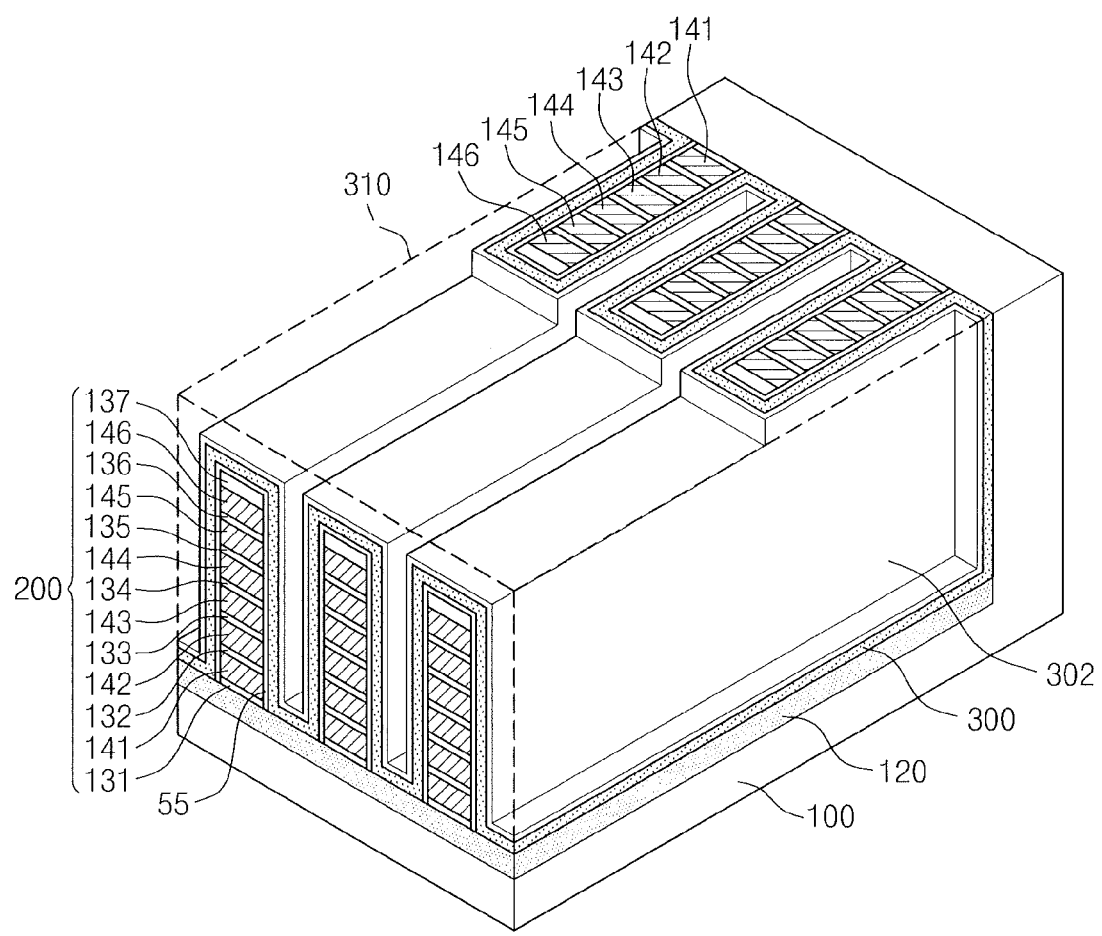

Referring to FIG. 25, the resultant structure in which the semiconductor layer 300 is formed is planarized to expose a top surface of the substrate 100. As described above, Whole thicknesses of the insulating layers 31~35 and the conductive layers 41~44 may be smaller than a step difference between the cell array region and the core region. In this embodiment, the middle interconnection 141~144 and the insulating layer patterns 131~135 are limitedly disposed inside the cell array region by the planarization process.

Each of the middle interconnection 141~144 limited into the cell array region may have an interconnection region parallel to a top surface of the substrate 100 and a contact region extending from one side or both sides of the interconnection region. At this time, the contact regions of the middle interconnections 141~144 are disposed at the boundary between the cell array region and the core region and top surfaces of the contact regions may be even with the exposed top surface of the substrate 100 by a result of the planarization process.

According to an embodiment, before the planarization process is performed, a buried insulating layer 310 filling the trench T while covering the resultant structure in which the surface-treated semiconductor layer 300 is formed may be further formed. In this case, top surfaces of the contact regions of the middle interconnections 141~144 may be exposed between the substrate 100 and the buried insulating layer 310.

Figure 26:
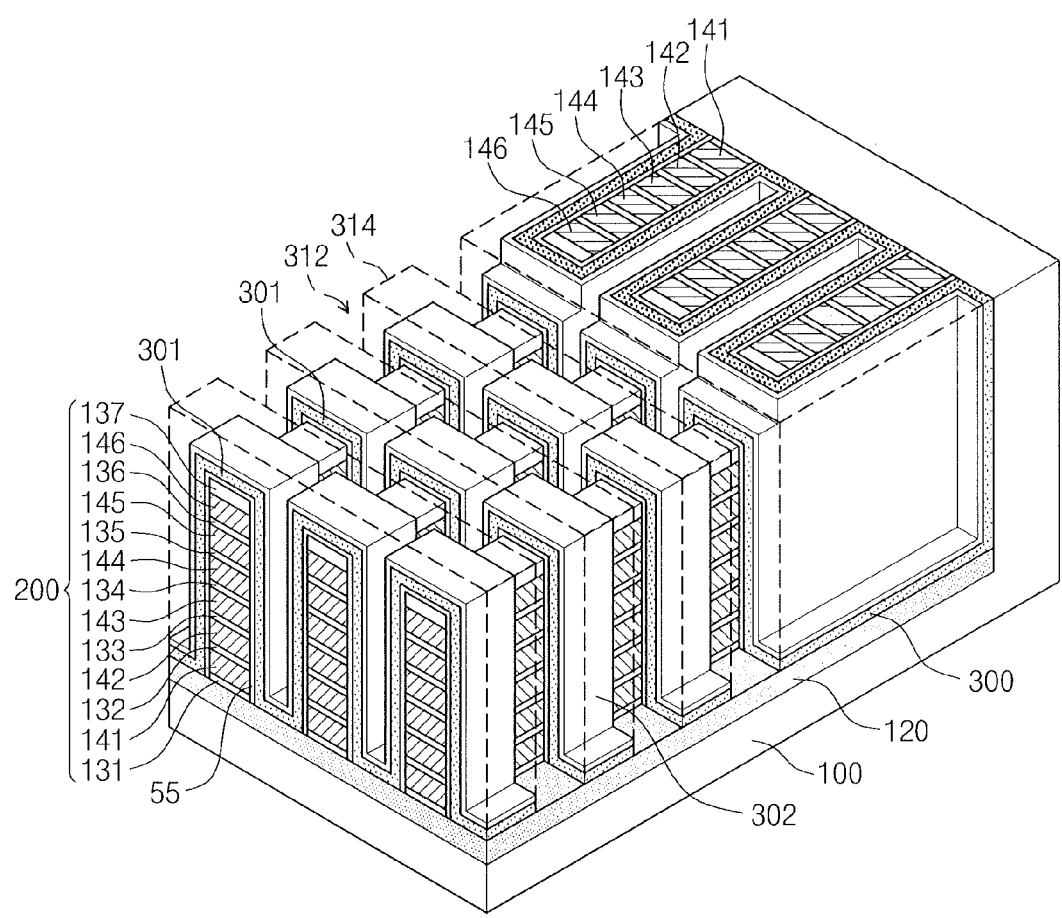

Referring to FIG. 26, the semiconductor layer 300 is patterned to form a plurality of semiconductor patterns 301 crossing the middle interconnection structures 200. Forming the semiconductor patterns 301 may include a step that after forming a buried insulating layer pattern 314 defining openings 312 exposing the semiconductor layer 300 by patterning the buried insulating layer 310, the exposed semiconductor layer 300 is etched. At this time, the openings 312 may be formed in a direction crossing the middle interconnection structures 200 and thereby the semiconductor patterns 301 are formed in a direction crossing the middle interconnection structures 200.

Etching the buried insulating layer 310 may be performed using an anisotropic etching method having an etching selectivity with respect to the semiconductor layer 300. Etching the semiconductor layer 300 may be performed using an etching method having an etching selectivity with respect to the buried insulating layer 310. Etching the semiconductor layer 300 may be performed using an isotropic etching method so that the semiconductor layer 300 can be separated from a viewpoint of the middle interconnection structure 200. However, etching the semiconductor layer 300 may be performed using an anisotropic etching method, an isotropic etching method or combinations thereof.

According to an embodiment, after forming the semiconductor pattern 301, the data storage layer pattern 55, as illustrated in FIG. 26, may be further etched so that the middle interconnection structure 200 is exposed.

Figure 27:
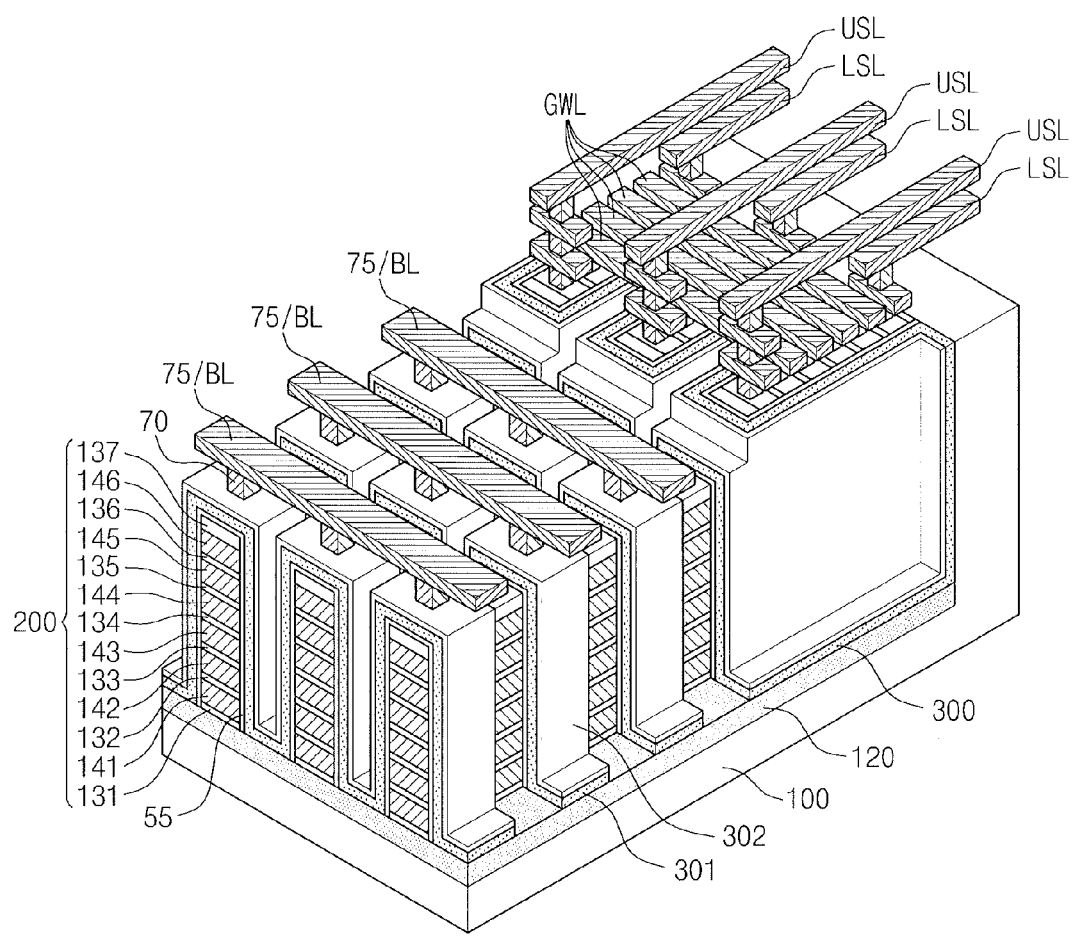

Referring to FIG. 27, after an insulating layer (not illustrated) filling the openings 312 is formed on the resultant structure in which the semiconductor patterns 301 are formed, upper interconnections 75 contacting the semiconductor patterns 301 and the middle interconnections 141~144 are formed. The upper interconnections 75 contacting the semiconductor patterns 301 and the middle interconnections 141~144 respectively may be used as the bit line (BL) and a global word line (GWL) described with reference to FIG. 3.

In addition, after the upper interconnections 75 are formed, an upper select line USL and a lower select line LSL contacting the most upper middle interconnection 144 and the lowest middle interconnection 141 respectively may be formed. The upper and lower select lines USL and LSL may be formed in a direction crossing the bit line BL.

Figure 28:
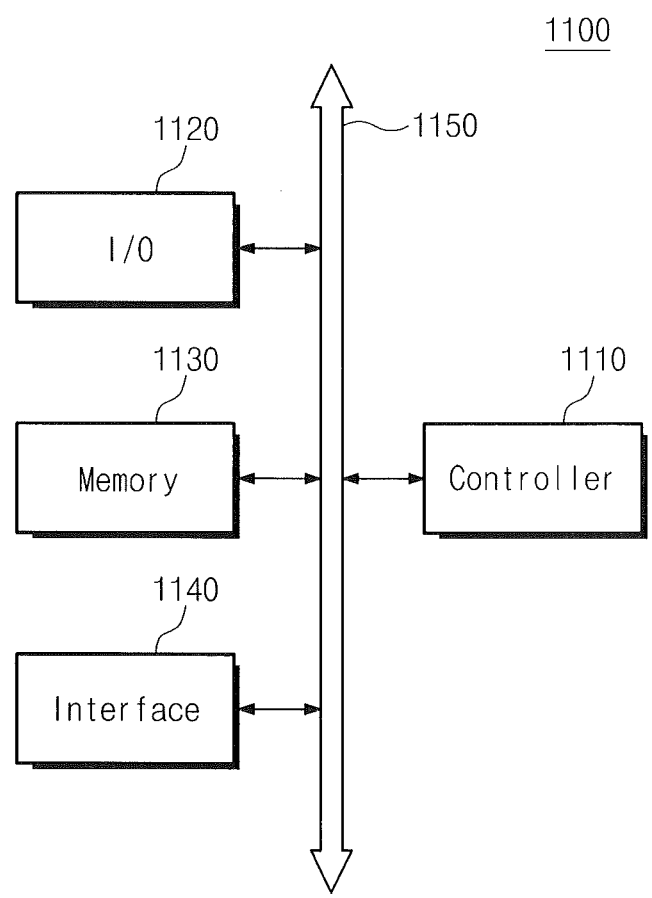
FIG. 28 is a block diagram illustrating an example of a memory system including the semiconductor memory device in accordance with embodiments of the present inventive concept.

FIG. 28 is a block diagram illustrating an example of a memory system including the semiconductor memory device in accordance with embodiments of the present inventive concept. Referring to FIG. 28, a memory system 1100 can be applied to PDA, a portable computer, a web tablet, a wireless phone, a mobile phone, a digital music player, a memory card or all the devices which can transmit/receive information in a wireless environment. The memory system 1100 includes a controller 1110, an input/output device 1120 such as a keypad and a display, a memory 1130, an interface 1140 and a bus 1150. The memory 1130 and the interface 1140 communicate with each other through the bus 1150.

The controller 1110 includes at least one microprocessor, digital signal process, micro controller or other process devices. The memory 1130 may be used to store a command executed by the controller 1110. The input/output device 1120 can receive data or a signal from the outside of the system 1100 or can transmit data or a signal to the outside of the system 1100. For example, the input/output device 1120 may include a keyboard, a keypad or a display device.

The memory 1130 includes a nonvolatile memory device in accordance with embodiments of the present inventive concept. The memory 1130 may further include a different kind of memory, a random accessible volatile memory and various kinds of memories.

The interface 1140 has a function of transmitting data to a communication network or receiving data from a communication network.

Figure 29:
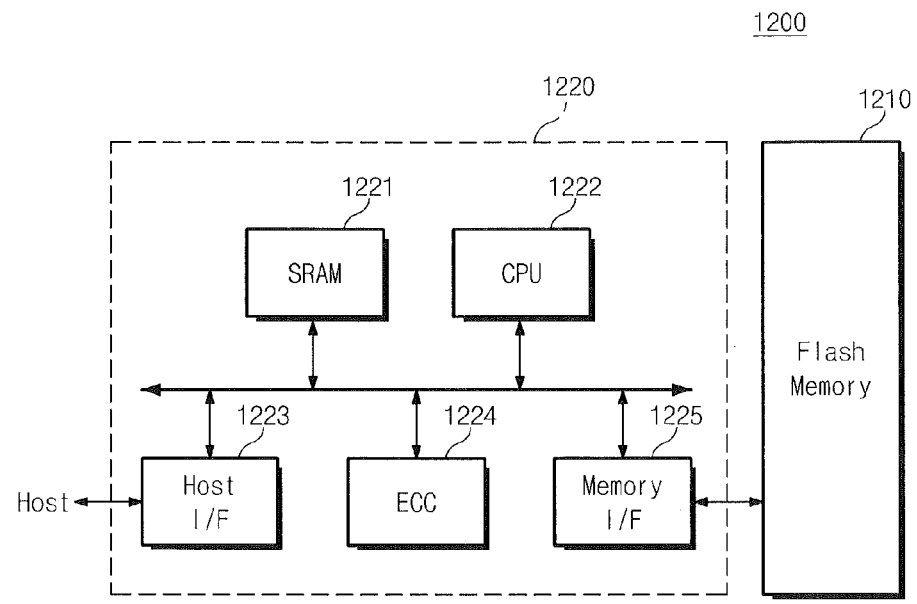
FIG. 29 is a block diagram illustrating an example of a memory card including the semiconductor memory device in accordance with embodiments of the present inventive concept.

FIG. 29 is a block diagram illustrating an example of a memory card including the semiconductor memory device in accordance with embodiments of the present inventive concept. Referring to FIG. 29, a memory card 1200 for supporting a storage capacity of huge amounts of data is fitted with a flash memory device 1210 in accordance with the present inventive concept. The memory card 1200 includes a memory controller 1220 controlling the whole data exchange between a host and the flash memory device 1210. A SRAM 1221 is used as an operational memory of a processing unit 1222. A host interface 1223 includes a data exchange protocol of a host being in contact with the memory card 1200. An error correction block 1224 detects and corrects errors included in data read from the multi-bit flash memory device 1210. A memory interface 1225 interfaces with the flash memory device 1210. A processing unit 1222 performs the whole control operations for an exchange of the memory controller 1220. Although not illustrated in FIG. 29, the memory card 1200 may further include a ROM (not illustrated) storing code data for an interface with the host.

Figure 30:
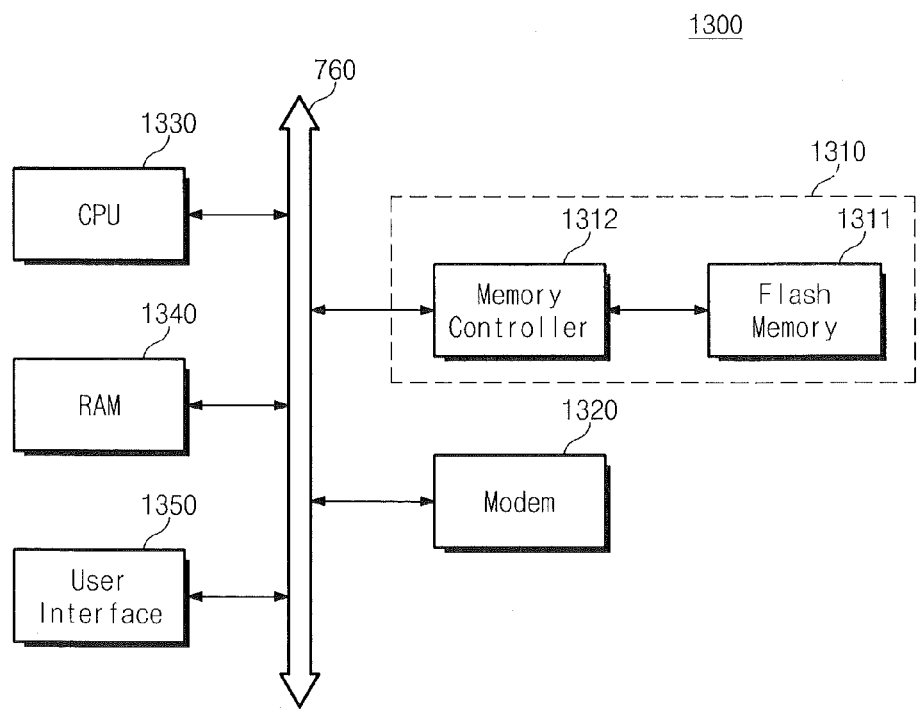
FIG. 30 is a block diagram illustrating an example of an information processing system including the semiconductor memory device in accordance with embodiments of the present inventive concept.

FIG. 30 is a block diagram illustrating an example of an information processing system including the semiconductor memory device in accordance with embodiments of the present inventive concept. Referring to FIG. 30, a flash memory system 1310 is built in an information processing system such as a mobile device or a desk top computer. The information processing system 1300 in accordance with the present inventive concept includes the flash memory system 1310 and a modem 1320, a central processing unit 1330, a RAM 1340 and a user interface 1350 that are electrically connected to a system bus 760. The flash memory system 1310 may be formed to be substantially identical to the memory system or the flash memory system described before. The flash memory system 1310 stores data processed by the central processing unit 1330 and data received from the outside. Here, the flash memory system 1310 may be constituted by a solid state drive (SSD) and in this case, the information processing system 1300 can stably store huge amounts of data in the flash memory system 1310. As reliability increases, the flash memory system 1310 can reduce resources required to correct errors and thereby the information processing system 1300 can exchange data at a high speed. Although not illustrated in FIG. 30, the information processing system 1300 may further include an application chipset, a camera image processor (CIS) and an input/output device.

The flash memory device or the memory system in accordance with the present inventive concept may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to an embodiment of the present inventive concept, an interface trap density due to a crystal structure difference at a boundary between a semiconductor layer and a buried layer filling the inside of the semiconductor layer of cylindrical shape can be reduced by performing a surface treatment process for a back side of the semiconductor layer of cylindrical shape used as channels of memory cell transistors that are three dimensionally arranged to form an oxide passivation layer. Therefore, an electrical characteristic (for example, charge mobility) of a transistor using the semiconductor layer perpendicular to a substrate as a channel can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of forming a nonvolatile memory device, comprising:
    forming a vertical stack of nonvolatile memory cells on a substrate by:
        forming a vertical stack of spaced-apart gate electrodes on a first sidewall of a vertical silicon active layer; and
        treating a second sidewall of the vertical silicon active layer with an oxidizing species that converts a surface of the second sidewall into a silicon dioxide passivation layer;
    wherein said forming the vertical stack of nonvolatile memory cells comprises:
        forming a thin layer structure containing first and second different material layers that are sequentially and repeatedly stacked; then
        forming a trench penetrating the thin layer structure; and then
        forming recessed regions exposing respective portions of the first sidewall of the vertical silicon active layer between the first material layers by removing the second material layers; and
    wherein said forming a vertical stack of spaced-apart gate electrodes comprises forming the vertical stack of spaced-apart gate electrodes in the recessed regions.

2. The method of claim 1, wherein said forming a vertical stack of nonvolatile memory cells further comprises forming a buried insulating pattern on the silicon dioxide passivation layer.

3. The method of claim 1, wherein said treating comprises converting the second sidewall of the silicon active layer into a silicon dioxide passivation layer using a dry thermal oxidation process.

4. The method of claim 1, wherein said treating comprises converting the second sidewall of the silicon active layer into a silicon dioxide passivation layer using an $O_2$, $O_2/N_2$ and/or $O_2/N_2O$ gas in a dry thermal oxidation process.

5. The method of claim 1, wherein said treating comprises converting the second sidewall of the silicon active layer into a silicon dioxide passivation layer using a $H_2/O_2$ and/or $H_2O$ gas in a wet thermal oxidation process.

6. The method of claim 1, wherein said treating comprises converting the second sidewall of the silicon active layer into a silicon dioxide passivation layer using a hydrogen gas, an oxygen gas and/or a hydrogen chloride gas in a radical oxidation process.

7. The method of claim 1, wherein said treating comprises converting the second sidewall of the silicon active layer into a silicon dioxide passivation layer by oxidizing the second sidewall under an atmosphere containing a halogen gas selected from a group consisting of HCl, HF, $NF_3$, HBr, $CL_2$, $BCl_3$, $F_2$ and $Br_2$.

8. A method of manufacturing a three-dimensional semiconductor memory device, comprising:
    forming a thin layer structure comprised of a plurality of thin layers on a substrate, said thin layer structure comprising first and second different material layers that are sequentially and repeatedly stacked;
    forming a penetration region exposing the substrate by patterning the thin layer structure;
    conformally forming a semiconductor layer on an inner wall of the penetration region;
    forming an oxide passivation layer on a surface of the semiconductor layer exposed to the penetration region by performing a surface treatment process for the semiconductor layer;
    forming a trench penetrating the thin layer structure between the semiconductor layers;
    forming a recessed region exposing a sidewall of the semiconductor layer between the first material layers by removing the second material layers; and
    forming a conductive pattern filling the recessed region.

9. The method of claim 8, wherein performing a surface treatment process for the semiconductor layer is to perform a thermal oxidation process or a radical oxidation process on the semiconductor layer.

10. The method of claim 8, wherein a thickness of the semiconductor layer is smaller than half of a thickness of the penetration region.

11. The method of claim 8, wherein the semiconductor layer is formed of a polycrystalline silicon layer, the semiconductor layer comprises an outer wall that is in contact with the thin layer structure and an inner wall spaced apart from the outer wall, and performing a surface treatment process for the semiconductor layer is to make silicon atoms in the inner wall of the semiconductor layer react to oxygen atoms.

12. The method of claim 8, after performing a surface treatment process for the semiconductor layer, further comprising forming an insulating layer filling the penetration region.

13. The method of claim 12, wherein the insulating layer comprises a CVD oxide layer, a PECVD oxide layer, a HDP oxide layer or a SOG layer.

14. The method of claim 8, wherein before forming the conductive pattern, further comprising forming a data storage layer covering a sidewall of the semiconductor layer exposed to the recessed region and surfaces of the first material layers.

* * * * *